US012568594B1

(12) United States Patent
Lewis, II et al.

(10) Patent No.: US 12,568,594 B1

(45) Date of Patent: ***Mar. 3, 2026

(54) CASTER ATTACHMENT SYSTEM USING MATING FEATURES

(71) Applicant: CHATSWORTH PRODUCTS, INC., Simi Valley, CA (US)

(72) Inventors: Richard Evans Lewis, II, Austin, TX (US); Preston Ellis Hennrich, Leander, TX (US)

(73) Assignee: Chatsworth Products, Inc., Simi Valley, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 18/778,932

(22) Filed: Jul. 20, 2024

Related U.S. Application Data

(63) Continuation of application No. 17/550,980, filed on Dec. 14, 2021, now Pat. No. 12,048,108.

(Continued)

(51) Int. Cl.
  H05K 5/02      (2006.01)
  B60B 33/00    (2006.01)

(52) U.S. Cl.
  CPC ....... H05K 5/0234 (2013.01); B60B 33/0007 (2013.01); B60B 33/0026 (2013.01)

(58) Field of Classification Search
  CPC .............. H05K 5/0234; B60B 33/0007; B60B 33/0026

See application file for complete search history.

(56) References Cited

U.S. PATENT DOCUMENTS

| | | | |
|---|---|---|---|
| 1,564,611 | A | 12/1925 | Mountford et al. |
| 1,589,613 | A | 6/1926 | Mountford et al. |

(Continued)

FOREIGN PATENT DOCUMENTS

| | | |
|---|---|---|
| AU | 2021218144 B2 | 10/2023 |
| CN | 102177633 A | 9/2011 |

(Continued)

OTHER PUBLICATIONS

Information Disclosure Statement (IDS) Letter Regarding Common Patent Application(s), dated Jul. 28, 2025.

(Continued)

*Primary Examiner* — Daniel J Rohrhoff

(74) *Attorney, Agent, or Firm* — Tillman Wright, PLLC; James D. Wright; David R. Higgins

(57) ABSTRACT

A caster assembly for installation in an electronic equipment enclosure includes a top plate, a forked support member, and an axled wheel. The top plate is attachable to a frame structure of the electronic equipment enclosure and includes a plurality of countersunk recesses. The forked support member extends downward from the top plate, and the axled wheel is supported on the forked support member. The caster assembly is installable in an assembled electronic equipment enclosure by aligning the countersunk recesses of the top plate beneath mating features at an underside of the frame structure such that, once aligned, the weight of the assembled electronic equipment enclosure retains each mating feature of the frame structure within a respective one of the plurality of countersunk recesses in the top plate, thereby retaining the caster assembly in position to support the assembled electronic equipment enclosure.

19 Claims, 12 Drawing Sheets

Related U.S. Application Data

(60) Provisional application No. 63/125,499, filed on Dec. 15, 2020.

(56) References Cited

U.S. PATENT DOCUMENTS

| | | | |
|---|---|---|---|
| 2,206,739 A | 7/1940 | Brogren et al. |
| 2,390,752 A | 12/1945 | Tinnerman |
| 2,406,415 A | 8/1946 | Tinnerman |
| 2,426,799 A | 9/1947 | Tinnerman |
| 2,430,555 A | 11/1947 | Burke |
| 2,495,037 A | 1/1950 | Tinnerman |
| 2,676,680 A | 4/1954 | Kindorf |
| 2,695,046 A | 11/1954 | Tinnerman, III |
| 2,724,419 A | 11/1955 | Poupitch |
| 2,778,000 A | 1/1957 | Mills |
| 2,875,804 A | 3/1959 | Flora |
| 3,019,409 A | 1/1962 | Sarafinas |
| 3,034,844 A | 5/1962 | Anderson et al. |
| 3,035,624 A | 5/1962 | Jaworski |
| 3,192,823 A | 7/1965 | Munse |
| 3,247,312 A | 4/1966 | Allessi |
| 3,355,695 A | 11/1967 | Overesch |
| 3,404,931 A | 10/1968 | Fall et al. |
| 3,431,590 A | 3/1969 | Anderson |
| 3,486,158 A | 12/1969 | Soltysik et al. |
| 3,563,627 A | 2/1971 | Whipps |
| 3,655,254 A | 4/1972 | Mayer et al. |
| 3,778,932 A | 12/1973 | Ewing |
| 3,810,069 A | 5/1974 | Jaconette, Jr. |
| 3,857,625 A | 12/1974 | Crane et al. |
| 3,919,457 A | 11/1975 | Steiner |
| 4,040,694 A | 8/1977 | Lascarrou |
| 4,045,104 A | 8/1977 | Peterson |
| 4,101,233 A | 7/1978 | McConnell |
| 4,411,552 A * | 10/1983 | Lanham .................... F16B 5/02 |
| | | 403/388 |
| 4,417,366 A | 11/1983 | Salice |
| 4,473,166 A | 9/1984 | Breiter |
| 4,497,411 A | 2/1985 | DeBortoli |
| 4,553,674 A | 11/1985 | Yoshikawa et al. |
| 4,575,295 A | 3/1986 | Rebentisch |
| 4,613,174 A | 9/1986 | Berg et al. |
| 4,620,392 A | 11/1986 | Kerpers et al. |
| 4,643,319 A | 2/1987 | Debus et al. |
| 4,723,749 A | 2/1988 | Carraro et al. |
| 4,796,541 A | 1/1989 | Halstrick |
| 4,803,756 A | 2/1989 | Hufnagel |
| 4,887,949 A | 12/1989 | Dimmick, III et al. |
| 4,941,717 A | 7/1990 | Beaulieu |
| 4,966,563 A | 10/1990 | Pierce et al. |
| 4,974,289 A | 12/1990 | Piard |
| 4,993,959 A | 2/1991 | Randolph |
| 5,009,383 A | 4/1991 | Chapman |
| 5,020,866 A | 6/1991 | McIlwraith |
| 5,054,978 A | 10/1991 | Kowalski |
| 5,067,863 A | 11/1991 | Kowalski |
| 5,078,537 A | 1/1992 | Nomura |
| 5,147,121 A | 9/1992 | McIlwraith |
| 5,165,770 A | 11/1992 | Hahn |
| 5,199,836 A | 4/1993 | Gogarty |
| 5,212,907 A | 5/1993 | Van Sandt |
| 5,228,762 A | 7/1993 | Mascrier |
| RE34,393 E | 9/1993 | McIlwraith |
| 5,271,586 A | 12/1993 | Schmidt |
| 5,294,748 A | 3/1994 | Schwenk et al. |
| 5,372,262 A | 12/1994 | Benson et al. |
| 5,380,083 A | 1/1995 | Jones et al. |
| 5,388,903 A | 2/1995 | Jones et al. |
| 5,391,084 A | 2/1995 | Krietzman |
| 5,441,337 A | 8/1995 | Mazura et al. |
| 5,536,079 A | 7/1996 | Kostic |
| 5,545,845 A | 8/1996 | Flores |
| 5,561,886 A | 10/1996 | Flamme |
| 5,570,940 A | 11/1996 | Maro |

| | | | |
|---|---|---|---|
| 5,593,046 A | 1/1997 | Katsuura et al. |
| 5,624,319 A | 4/1997 | Golczyk et al. |
| 5,639,150 A | 6/1997 | Anderson et al. |
| 5,728,973 A | 3/1998 | Jorgensen |
| 5,788,351 A | 8/1998 | Prunty et al. |
| 5,791,498 A | 8/1998 | Mills |
| 5,806,945 A | 9/1998 | Anderson et al. |
| 5,833,417 A | 11/1998 | Sargent et al. |
| 5,864,922 A | 2/1999 | Kraft |
| 5,899,545 A | 5/1999 | Besserer et al. |
| 5,926,916 A | 7/1999 | Lee et al. |
| 5,927,368 A | 7/1999 | Rohrer et al. |
| 5,933,563 A | 8/1999 | Schaffer et al. |
| 5,938,302 A | 8/1999 | Anderson et al. |
| 5,940,937 A | 8/1999 | Churchill et al. |
| 5,975,315 A | 11/1999 | Jordan |
| 5,983,590 A | 11/1999 | Serban |
| 5,991,975 A | 11/1999 | Baer |
| 5,997,117 A | 12/1999 | Krietzman |
| 6,000,769 A | 12/1999 | Chen |
| 6,000,771 A | 12/1999 | Wissinger et al. |
| 6,019,446 A | 2/2000 | Laboch et al. |
| 6,024,330 A | 2/2000 | Mroz et al. |
| 6,036,290 A | 3/2000 | Jancsek et al. |
| 6,082,878 A | 7/2000 | Doubek |
| 6,083,010 A | 7/2000 | Daoud |
| 6,086,300 A | 7/2000 | Frohlich |
| 6,123,203 A | 9/2000 | Gibbons |
| 6,123,400 A | 9/2000 | Nicolai et al. |
| 6,146,071 A | 11/2000 | Norkus et al. |
| 6,152,554 A | 11/2000 | Parisi |
| 6,161,803 A | 12/2000 | Daoud |
| 6,185,098 B1 | 2/2001 | Benavides |
| 6,215,069 B1 | 4/2001 | Martin et al. |
| 6,220,554 B1 | 4/2001 | Daoud |
| 6,254,207 B1 | 7/2001 | Leneutre |
| 6,270,283 B1 | 8/2001 | Turati |
| 6,293,637 B1 | 9/2001 | Anderson et al. |
| 6,299,268 B1 | 10/2001 | Carle et al. |
| 6,321,917 B1 | 11/2001 | Mendoza |
| 6,348,655 B1 | 2/2002 | Wright |
| 6,365,834 B1 | 4/2002 | Larsen et al. |
| 6,394,398 B1 | 5/2002 | Reed et al. |
| 6,401,940 B1 | 6/2002 | Hartel et al. |
| 6,425,488 B1 | 7/2002 | Notohardjono et al. |
| 6,425,648 B1 | 7/2002 | Notohardjono et al. |
| 6,427,952 B2 | 8/2002 | Caveney et al. |
| 6,428,127 B1 | 8/2002 | Rasmussen |
| 6,431,885 B1 | 8/2002 | Stroup |
| 6,457,924 B1 | 10/2002 | Wallace |
| 6,467,633 B2 | 10/2002 | Mendoza |
| 6,468,112 B1 | 10/2002 | Follingstad et al. |
| 6,481,160 B1 | 11/2002 | Kowalczyk |
| 6,489,565 B1 | 12/2002 | Krietzman et al. |
| 6,501,899 B1 | 12/2002 | Marrs et al. |
| 6,502,702 B1 | 1/2003 | Hsue et al. |
| 6,504,100 B2 | 1/2003 | Lawrence et al. |
| 6,515,225 B1 | 2/2003 | Wright |
| 6,517,174 B2 | 2/2003 | Sevier |
| 6,520,345 B1 | 2/2003 | Marovic et al. |
| 6,527,351 B1 | 3/2003 | Sevier et al. |
| 6,535,681 B2 | 3/2003 | Daoud et al. |
| 6,541,705 B1 | 4/2003 | McGrath |
| 6,546,179 B2 | 4/2003 | Petri |
| 6,554,697 B1 | 4/2003 | Koplin |
| 6,561,602 B1 | 5/2003 | Sevier et al. |
| 6,565,166 B1 | 5/2003 | Bulk et al. |
| 6,584,267 B1 | 6/2003 | Caveney et al. |
| 6,605,782 B1 | 8/2003 | Krietzman et al. |
| 6,613,981 B1 | 9/2003 | Hathcock et al. |
| 6,614,978 B1 | 9/2003 | Caveney et al. |
| 6,632,999 B2 | 10/2003 | Sempliner et al. |
| 6,695,149 B1 | 2/2004 | Cote et al. |
| 6,712,434 B2 | 3/2004 | Knab et al. |
| 6,755,493 B1 | 6/2004 | Krietzman et al. |
| 6,760,531 B1 | 7/2004 | Solheid et al. |
| 6,762,360 B2 | 7/2004 | Wright |
| 6,796,437 B2 | 9/2004 | Krampotich et al. |
| 6,808,240 B2 | 10/2004 | Altena |

(56) References Cited

U.S. PATENT DOCUMENTS

| | | | |
|---|---|---|---|
| 6,814,244 B1 | 11/2004 | Hathcock |
| 6,831,225 B2 | 12/2004 | Chandler |
| 6,883,879 B2 | 4/2005 | Latchinian |
| 6,884,942 B2 | 4/2005 | McGrath et al. |
| 6,915,616 B2 | 7/2005 | Fontana et al. |
| 6,918,796 B2 | 7/2005 | Elliot et al. |
| 6,946,605 B2 | 9/2005 | Levesque et al. |
| 6,951,288 B2 | 10/2005 | Henderson |
| 6,964,588 B2 | 11/2005 | Follingstad et al. |
| 6,968,647 B2 | 11/2005 | Levesque et al. |
| 6,976,292 B2 | 12/2005 | MacPherson et al. |
| 6,981,893 B2 | 1/2006 | Barker et al. |
| 6,992,247 B2 | 1/2006 | Rasmussen et al. |
| 7,000,784 B2 | 2/2006 | Canty et al. |
| 7,019,213 B1 | 3/2006 | McNutt et al. |
| 7,026,553 B2 | 4/2006 | Levesque et al. |
| 7,119,282 B2 | 10/2006 | Krietzman et al. |
| 7,144,320 B2 | 12/2006 | Turek et al. |
| 7,178,292 B2 | 2/2007 | Yamada |
| 7,178,679 B2 | 2/2007 | Canty et al. |
| 7,200,316 B2 | 4/2007 | Giraud et al. |
| 7,220,150 B2 | 5/2007 | Follingstad et al. |
| 7,225,586 B2 | 6/2007 | Levesque et al. |
| 7,226,260 B2 | 6/2007 | Jackson, Jr. et al. |
| 7,255,640 B2 | 8/2007 | Aldag et al. |
| 7,259,326 B2 | 8/2007 | Nguyen |
| 7,285,027 B2 | 10/2007 | McGrath et al. |
| 7,293,666 B2 | 11/2007 | Mattlin et al. |
| 7,316,461 B2 | 1/2008 | Wyatt et al. |
| 7,362,941 B2 | 4/2008 | Rinderer et al. |
| 7,378,046 B2 | 5/2008 | Canty et al. |
| 7,381,100 B2 | 6/2008 | Follingstad et al. |
| 7,417,188 B2 | 8/2008 | McNutt et al. |
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,458,859 B2 | 12/2008 | McGrath et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| 7,542,287 B2 | 6/2009 | Lewis, II et al. |
| 7,547,228 B1 | 6/2009 | Schlarman |
| 7,592,541 B2 | 9/2009 | Adducci et al. |
| 7,608,779 B2 | 10/2009 | Adducci et al. |
| 7,637,771 B2 | 12/2009 | Laursen |
| 7,667,135 B2 | 2/2010 | Adducci et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,746,637 B2 | 6/2010 | Donowho et al. |
| 7,762,405 B2 | 7/2010 | Vogel et al. |
| 7,764,495 B2 | 7/2010 | Hruby et al. |
| 7,772,489 B2 | 8/2010 | Adducci et al. |
| 7,778,513 B2 | 8/2010 | Rinderer et al. |
| 7,781,675 B2 | 8/2010 | Adducci et al. |
| 7,789,606 B2 | 9/2010 | Kosidlo, IV et al. |
| 7,795,532 B2 | 9/2010 | Walker |
| 7,804,685 B2 | 9/2010 | Krietzman |
| 7,823,846 B2 | 11/2010 | Williams, III |
| 7,839,635 B2 | 11/2010 | Donowho et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,974,105 B2 | 7/2011 | Dean, Jr. et al. |
| 7,999,183 B2 | 8/2011 | Garza et al. |
| 8,035,965 B2 | 10/2011 | Adducci et al. |
| 8,040,673 B2 | 10/2011 | Krietzman |
| 8,049,109 B2 | 11/2011 | Sempliner et al. |

| | | | |
|---|---|---|---|
| 8,107,238 B2 | 1/2012 | Krietzman et al. |
| 8,138,419 B2 | 3/2012 | Garza et al. |
| 8,141,885 B2 | 3/2012 | Fan et al. |
| 8,220,110 B1 | 7/2012 | Chen |
| 8,235,634 B2 | 8/2012 | Larsen et al. |
| 8,237,052 B2 | 8/2012 | Adducci et al. |
| 8,263,867 B2 | 9/2012 | Garza et al. |
| 8,273,989 B2 | 9/2012 | Garza et al. |
| 8,281,940 B2 | 10/2012 | Fan |
| 8,317,274 B2 | 11/2012 | Hsiao |
| 8,330,043 B2 | 12/2012 | Alaniz et al. |
| 8,395,046 B2 | 3/2013 | Nicewicz et al. |
| 8,405,984 B2 | 3/2013 | Donowho et al. |
| 8,424,691 B2 | 4/2013 | McMillan, III et al. |
| 8,443,987 B2 | 5/2013 | Peng et al. |
| 8,459,918 B2 | 6/2013 | Lin et al. |
| 8,556,357 B2 | 10/2013 | Fan |
| 8,628,158 B2 | 1/2014 | Caveney |
| 8,653,363 B2 | 2/2014 | Behrens et al. |
| 8,683,762 B2 | 4/2014 | Rodriquez et al. |
| 8,730,665 B2 | 5/2014 | Lewis, II et al. |
| 8,737,068 B2 | 5/2014 | Krietzman et al. |
| 8,746,466 B2 | 6/2014 | Taylor |
| 8,787,023 B2 | 7/2014 | Lewis, II et al. |
| 8,844,888 B1 | 9/2014 | Gretz |
| 8,867,206 B2 | 10/2014 | Hruby et al. |
| 8,879,881 B2 | 11/2014 | Cote et al. |
| 8,901,438 B2 * | 12/2014 | Lewis, II ............ H05K 7/20009 |
| | | 174/559 |
| 8,966,821 B2 | 3/2015 | Walker et al. |
| 8,973,951 B2 | 3/2015 | Nicewicz |
| 9,055,677 B2 | 6/2015 | Garza, Jr. et al. |
| 9,084,369 B2 | 7/2015 | Lewis, II et al. |
| 9,119,329 B2 | 8/2015 | Krietzman et al. |
| 9,185,824 B2 | 11/2015 | Nordin et al. |
| 9,210,833 B2 | 12/2015 | Caveney et al. |
| 9,332,863 B2 | 5/2016 | Ramey et al. |
| 9,351,427 B2 | 5/2016 | Lewis, II et al. |
| 9,408,326 B2 | 8/2016 | Lewis, II et al. |
| 9,420,727 B2 | 8/2016 | Lewis, II et al. |
| 9,452,638 B1 | 9/2016 | Linn et al. |
| 9,548,597 B2 | 1/2017 | Vacca et al. |
| 9,549,487 B2 | 1/2017 | Lewis, II et al. |
| 9,572,286 B2 | 2/2017 | Greeson et al. |
| 9,627,860 B2 | 4/2017 | Proserpio et al. |
| 9,642,270 B2 | 5/2017 | Lewis, II et al. |
| 9,781,852 B2 | 10/2017 | Garza, Jr. et al. |
| 9,795,060 B2 | 10/2017 | Greeson et al. |
| 9,801,309 B2 | 10/2017 | Krietzman et al. |
| 9,814,159 B2 | 11/2017 | Lewis, II et al. |
| 9,943,003 B2 | 4/2018 | Segroves et al. |
| 9,949,406 B2 | 4/2018 | Lewis, II et al. |
| 9,974,198 B2 | 5/2018 | Lewis, II et al. |
| 9,980,400 B2 | 5/2018 | Lewis, II et al. |
| 10,123,462 B2 | 11/2018 | Krietzman et al. |
| 10,178,784 B2 | 1/2019 | Lewis, II et al. |
| 10,182,651 B2 | 1/2019 | Jost et al. |
| 10,237,994 B2 | 3/2019 | Donowho et al. |
| 10,271,452 B2 | 4/2019 | Hennrich et al. |
| 10,334,748 B1 | 6/2019 | Kostenko et al. |
| 10,334,761 B2 | 6/2019 | Krietzman et al. |
| 10,337,550 B2 | 7/2019 | Davis et al. |
| 10,356,951 B2 | 7/2019 | Lewis, II et al. |
| 10,440,847 B2 | 10/2019 | Lewis, II et al. |
| 10,477,720 B2 | 11/2019 | Hennrich et al. |
| 10,518,578 B1 * | 12/2019 | Spektor ................. B60B 33/06 |
| 10,568,239 B2 | 2/2020 | Krietzman et al. |
| 10,588,227 B2 | 3/2020 | Donowho et al. |
| 10,595,442 B2 | 3/2020 | Davis |
| 10,624,232 B2 | 4/2020 | Krietzman |
| 10,653,025 B2 | 5/2020 | Garza et al. |
| 10,674,634 B2 | 6/2020 | Lewis, II et al. |
| 10,765,037 B2 | 9/2020 | Lewis, II et al. |
| 10,791,640 B2 | 9/2020 | Lewis, II et al. |
| 10,859,111 B2 | 12/2020 | Davis |
| 10,863,644 B1 | 12/2020 | Tseng et al. |
| 11,039,543 B2 | 6/2021 | Donowho et al. |
| 11,071,227 B2 | 7/2021 | Hennrich et al. |
| 11,083,108 B2 | 8/2021 | Lewis, II et al. |

(56)  References Cited

U.S. PATENT DOCUMENTS

| | | |
|---|---|---|
| 11,162,615 B2 | 11/2021 | Hennrich et al. |
| 11,209,039 B2 | 12/2021 | Davis et al. |
| 11,212,928 B2 | 12/2021 | Lewis, II et al. |
| 11,268,636 B2 | 3/2022 | Hennrich et al. |
| 11,342,730 B1 | 5/2022 | Thompson et al. |
| 11,444,438 B2 | 9/2022 | Schindler et al. |
| 11,464,123 B2 | 10/2022 | Garza, Jr. et al. |
| 11,464,132 B2 | 10/2022 | Krietzman |
| 11,493,151 B2 | 11/2022 | Hennrich et al. |
| 11,547,020 B2 | 1/2023 | Lewis, II et al. |
| 11,619,328 B2 | 4/2023 | Hennrich et al. |
| 11,622,458 B1 | 4/2023 | Hennrich et al. |
| 11,622,469 B2 | 4/2023 | Waz et al. |
| 11,627,677 B1 | 4/2023 | Hennrich et al. |
| 11,644,125 B2 | 5/2023 | Hennrich |
| 11,644,126 B2 | 5/2023 | Hennrich et al. |
| 11,678,447 B2 | 6/2023 | Lewis, II et al. |
| 11,678,456 B1 | 6/2023 | Krietzman et al. |
| 11,678,458 B1 | 6/2023 | Krietzman et al. |
| 11,706,898 B2 | 7/2023 | Krietzman |
| 11,785,745 B2 | 10/2023 | Lewis, II et al. |
| 11,792,948 B2 | 10/2023 | Garza, Jr. et al. |
| 11,815,197 B2 | 11/2023 | Hennrich et al. |
| 11,818,860 B1 | 11/2023 | Krietzman et al. |
| 11,818,861 B1 | 11/2023 | Krietzman et al. |
| 11,818,862 B1 | 11/2023 | Krietzman et al. |
| 11,846,312 B2 | 12/2023 | Davis et al. |
| 11,903,156 B1 | 2/2024 | Hennrich et al. |
| 11,920,392 B1 | 3/2024 | Krietzman et al. |
| 11,985,799 B2 | 5/2024 | Lewis, II et al. |
| 12,048,108 B1* | 7/2024 | Lewis, II ............ H05K 5/0234 |
| 12,052,843 B2 | 7/2024 | Krietzman et al. |
| 12,082,379 B2 | 9/2024 | Lewis, II et al. |
| 12,089,363 B1 | 9/2024 | Krietzman et al. |
| 12,108,553 B2 | 10/2024 | Garza, Jr. et al. |
| 12,160,974 B1 | 12/2024 | Krietzman et al. |
| 12,264,698 B2 | 4/2025 | Davis |
| 12,342,486 B1 | 6/2025 | Hennrich et al. |
| 12,428,888 B1 | 9/2025 | Krietzman et al. |
| 2002/0046979 A1 | 4/2002 | Larsen et al. |
| 2002/0074149 A1 | 6/2002 | Lawrence et al. |
| 2002/0149911 A1 | 10/2002 | Bishop et al. |
| 2002/0172013 A1 | 11/2002 | Chandler |
| 2003/0020379 A1 | 1/2003 | Larsen et al. |
| 2003/0034717 A1 | 2/2003 | Yao |
| 2003/0079897 A1 | 5/2003 | Sempliner et al. |
| 2003/0226238 A1 | 12/2003 | Baer |
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0093688 A1* | 5/2004 | Lucht ................... B60B 33/001 |
| | | 16/38 |
| 2004/0154818 A1 | 8/2004 | Franks, Jr. |
| 2004/0181916 A1 | 9/2004 | Arduini |
| 2004/0183409 A1 | 9/2004 | Rinderer |
| 2004/0190270 A1 | 9/2004 | Aldag et al. |
| 2004/0201335 A1 | 10/2004 | Davis |
| 2005/0220562 A1 | 10/2005 | Blackaby |
| 2005/0247650 A1 | 11/2005 | Vogel et al. |
| 2006/0102575 A1 | 5/2006 | Mattlin et al. |
| 2006/0103270 A1 | 5/2006 | Bergesch et al. |
| 2006/0141921 A1 | 6/2006 | Turek et al. |
| 2007/0064389 A1 | 3/2007 | Lewis, II et al. |
| 2007/0064391 A1 | 3/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0249237 A1 | 10/2007 | Follingstad et al. |
| 2007/0257159 A1 | 11/2007 | Nelson et al. |
| 2007/0257169 A1 | 11/2007 | Taggett |
| 2007/0293138 A1 | 12/2007 | Adducci et al. |
| 2008/0035810 A1 | 2/2008 | Lewis, II |
| 2008/0036339 A1 | 2/2008 | Adducci et al. |
| 2008/0036340 A1 | 2/2008 | Adducci et al. |
| 2008/0037228 A1 | 2/2008 | Lewis, II |
| 2008/0062654 A1 | 3/2008 | Mattlin et al. |
| 2008/0067903 A1 | 3/2008 | Adducci et al. |
| 2008/0067904 A1 | 3/2008 | Adducci et al. |
| 2008/0074012 A1 | 3/2008 | Adducci et al. |
| 2008/0074849 A1 | 3/2008 | Adducci et al. |
| 2008/0079340 A1 | 4/2008 | Adducci et al. |
| 2008/0130262 A1 | 6/2008 | Rinderer et al. |
| 2008/0141495 A1 | 6/2008 | Fisher |
| 2008/0155915 A1 | 7/2008 | Howe et al. |
| 2008/0174217 A1 | 7/2008 | Walker |
| 2008/0266789 A1 | 10/2008 | Hruby et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1 | 5/2009 | Donowho et al. |
| 2009/0134750 A1 | 5/2009 | Adducci et al. |
| 2009/0151983 A1 | 6/2009 | Sempliner et al. |
| 2009/0165250 A1 | 7/2009 | Duan et al. |
| 2009/0190307 A1 | 7/2009 | Krietzman |
| 2009/0227197 A1 | 9/2009 | Lewis, II et al. |
| 2009/0236117 A1 | 9/2009 | Garza et al. |
| 2009/0239461 A1 | 9/2009 | Lewis, II et al. |
| 2009/0283488 A1 | 11/2009 | McMillan, III et al. |
| 2010/0003911 A1 | 1/2010 | Graczyk et al. |
| 2010/0061059 A1 | 3/2010 | Krietzman et al. |
| 2010/0084188 A1 | 4/2010 | Rajvanshi et al. |
| 2010/0096105 A1 | 4/2010 | Novotny et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2010/0264788 A1 | 10/2010 | Adducci et al. |
| 2010/0300648 A1 | 12/2010 | Grantham |
| 2010/0315775 A1 | 12/2010 | Grantham et al. |
| 2011/0001408 A1 | 1/2011 | Caveney et al. |
| 2011/0019362 A1 | 1/2011 | Krietzman |
| 2011/0020091 A1 | 1/2011 | Larsen et al. |
| 2011/0069450 A1 | 3/2011 | Adducci et al. |
| 2011/0083873 A1 | 4/2011 | Hartman et al. |
| 2011/0084580 A1 | 4/2011 | Adducci et al. |
| 2011/0095495 A1* | 4/2011 | Fan ........................ B60B 33/04 |
| | | 280/30 |
| 2011/0100668 A1 | 5/2011 | Syed |
| 2011/0111686 A1 | 5/2011 | Hruby et al. |
| 2011/0148261 A1 | 6/2011 | Donowho et al. |
| 2011/0173906 A1 | 7/2011 | Reddicliffe |
| 2011/0278060 A1 | 11/2011 | Rajvanshi et al. |
| 2011/0278998 A1 | 11/2011 | Caveney et al. |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2011/0308179 A1 | 12/2011 | Pirner |
| 2012/0012543 A1 | 1/2012 | Fan |
| 2012/0013229 A1 | 1/2012 | Krietzman |
| 2012/0043869 A1 | 2/2012 | Liu et al. |
| 2012/0049706 A1 | 3/2012 | Cottuli et al. |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0080984 A1 | 4/2012 | Watts |
| 2012/0110788 A1 | 5/2012 | Chen |
| 2012/0134763 A1 | 5/2012 | Lin et al. |
| 2012/0181906 A1 | 7/2012 | Caveney |

(56) References Cited

U.S. PATENT DOCUMENTS

| | | |
|---|---|---|
| 2012/0194999 A1 | 8/2012 | Krietzman et al. |
| 2012/0244729 A1 | 9/2012 | Rivera et al. |
| 2012/0267991 A1 | 10/2012 | Adducci et al. |
| 2012/0279779 A1 | 11/2012 | Cottuli et al. |
| 2012/0292278 A1 | 11/2012 | Schluter et al. |
| 2012/0305307 A1 | 12/2012 | Korcz et al. |
| 2013/0069501 A1 | 3/2013 | Liu |
| 2014/0132134 A1 | 5/2014 | Garza, Jr. et al. |
| 2014/0265774 A1 | 9/2014 | Stewart, Jr. et al. |
| 2014/0319084 A1 | 10/2014 | Lewis, II et al. |
| 2014/0323029 A1 | 10/2014 | Lewis, II et al. |
| 2014/0334099 A1 | 11/2014 | Krietzman et al. |
| 2015/0008810 A1 | 1/2015 | Ivey et al. |
| 2015/0023619 A1 | 1/2015 | Yin et al. |
| 2015/0030300 A1 | 1/2015 | Terry et al. |
| 2015/0065028 A1 | 3/2015 | Krietzman |
| 2015/0069888 A1* | 3/2015 | Lewis, II ............... A47B 47/00 |
| | | 312/223.1 |
| 2015/0136714 A1 | 5/2015 | Franklin |
| 2015/0173253 A1 | 6/2015 | Lewis, II et al. |
| 2015/0250071 A1 | 9/2015 | Garza, Jr. et al. |
| 2015/0264839 A1 | 9/2015 | Lewis, II et al. |
| 2015/0282390 A1 | 10/2015 | Lewis, II et al. |
| 2015/0319872 A1 | 11/2015 | Lewis, II et al. |
| 2015/0333303 A1 | 11/2015 | Hachiya et al. |
| 2015/0342082 A1 | 11/2015 | Roehrl et al. |
| 2015/0351289 A1 | 12/2015 | Krietzman et al. |
| 2015/0366094 A1 | 12/2015 | Segroves et al. |
| 2016/0138261 A1 | 5/2016 | Zhang et al. |
| 2016/0262277 A1 | 9/2016 | Lewis, II et al. |
| 2016/0302317 A1 | 10/2016 | Lewis, II et al. |
| 2017/0127569 A1 | 5/2017 | Rimler et al. |
| 2017/0127570 A1 | 5/2017 | Lewis, II et al. |
| 2017/0150636 A1* | 5/2017 | Segroves ............. H05K 7/1488 |
| 2017/0150652 A1 | 5/2017 | Greeson et al. |
| 2017/0167523 A1 | 6/2017 | Davis et al. |
| 2017/0215587 A1 | 8/2017 | Jost et al. |
| 2017/0223864 A1 | 8/2017 | Jost et al. |
| 2017/0223865 A1 | 8/2017 | Lewis, II et al. |
| 2017/0254129 A1 | 9/2017 | Gompper et al. |
| 2017/0290181 A1 | 10/2017 | Donowho et al. |
| 2017/0331269 A1 | 11/2017 | Hansen |
| 2017/0332501 A1 | 11/2017 | Lewis, II et al. |
| 2018/0027677 A1 | 1/2018 | Garza, Jr. et al. |
| 2018/0042143 A1 | 2/2018 | Krietzman et al. |
| 2018/0110153 A1 | 4/2018 | Hennrich et al. |
| 2018/0213672 A1 | 7/2018 | Eckberg et al. |
| 2018/0228056 A1 | 8/2018 | Lewis, II et al. |
| 2018/0263127 A1 | 9/2018 | Lewis, II et al. |
| 2018/0270968 A1 | 9/2018 | Lewis, II et al. |
| 2019/0063483 A1 | 2/2019 | Davis |
| 2019/0098791 A1 | 3/2019 | Hennrich et al. |
| 2019/0098792 A1 | 3/2019 | Hennrich et al. |
| 2019/0215973 A1 | 7/2019 | Donowho et al. |
| 2019/0313551 A1 | 10/2019 | Krietzman et al. |
| 2019/0343023 A1 | 11/2019 | Lewis, II et al. |
| 2020/0039033 A1 | 2/2020 | Lai et al. |
| 2020/0077533 A1 | 3/2020 | Lu et al. |
| 2020/0077534 A1 | 3/2020 | Hennrich et al. |
| 2020/0113074 A1 | 4/2020 | Lewis, II et al. |
| 2020/0187387 A1 | 6/2020 | Lewis, II et al. |
| 2020/0196465 A1 | 6/2020 | Donowho et al. |
| 2020/0245494 A1 | 7/2020 | Krietzman |
| 2020/0275569 A1 | 8/2020 | Garza, Jr. et al. |
| 2020/0288605 A1 | 9/2020 | Lewis, II et al. |
| 2020/0367381 A1 | 11/2020 | Hennrich et al. |
| 2020/0367382 A1 | 11/2020 | Hennrich et al. |
| 2020/0383230 A1 | 12/2020 | Hennrich et al. |
| 2020/0396868 A1 | 12/2020 | Lewis, II et al. |
| 2021/0014988 A1 | 1/2021 | Lewis, II et al. |
| 2021/0079944 A1 | 3/2021 | Davis |
| 2021/0219443 A1* | 7/2021 | Curlee ................. H05K 5/0234 |
| 2021/0219446 A1* | 7/2021 | Curlee ................. F16F 15/085 |
| 2021/0307183 A1 | 9/2021 | Donowho et al. |
| 2021/0329808 A1 | 10/2021 | Hennrich et al. |
| 2021/0345516 A1* | 11/2021 | Waz ..................... H05K 7/183 |
| 2021/0385976 A1 | 12/2021 | Lewis, II et al. |
| 2022/0034430 A1 | 2/2022 | Hennrich et al. |
| 2022/0099133 A1 | 3/2022 | Davis |
| 2022/0124924 A1 | 4/2022 | Lewis, II et al. |
| 2022/0183190 A1 | 6/2022 | Lewis, II et al. |
| 2022/0235883 A1 | 7/2022 | Hennrich et al. |
| 2023/0013890 A1 | 1/2023 | Garza, Jr. et al. |
| 2023/0014492 A1 | 1/2023 | Krietzman |
| 2023/0065144 A1 | 3/2023 | Hennrich et al. |
| 2023/0156974 A1 | 5/2023 | Lewis, II et al. |
| 2023/0243445 A1 | 8/2023 | Hennrich et al. |
| 2023/0328914 A1 | 10/2023 | Krietzman |
| 2024/0015911 A1 | 1/2024 | Garza, Jr. et al. |
| 2024/0032259 A1 | 1/2024 | Lewis, II et al. |
| 2024/0093716 A1 | 3/2024 | Davis |
| 2025/0071920 A1 | 2/2025 | Garza, Jr. et al. |

FOREIGN PATENT DOCUMENTS

| | | | |
|---|---|---|---|
| CN | 108431433 A | 8/2018 | |
| CN | ZL201680073061.8 | 5/2021 | |
| DE | 29607244 U1 | 8/1997 | |
| DE | 19707594 A1 | 10/1997 | |
| DE | 20207426 U1 | 9/2002 | |
| DE | 10308389 A1 | 9/2004 | |
| EP | 0144955 A2 | 6/1985 | |
| EP | 2205054 A1 | 7/2010 | |
| EP | 2429271 | 3/2012 | |
| EP | 2429272 | 3/2012 | |
| EP | 3806253 A1 | 4/2021 | |
| ES | 2288005 T3 | 12/2007 | |
| FR | 1402979 A | 6/1965 | |
| FR | 2794501 A1 | 12/2000 | |
| FR | 2904732 A1 | 2/2008 | |
| GB | 981072 A | 1/1965 | |
| GB | 2261993 A | 6/1993 | |
| GB | 2366084 B | 9/2002 | |
| JP | H8-8-187537 | 7/1996 | |
| JP | 2019-502069 | 1/2019 | |
| JP | 7066618 | 5/2022 | |
| KR | 20200107112 A * | 9/2020 | ......... B60B 33/0018 |
| SE | 535066 C2 | 4/2012 | |
| TW | 201630514 A | 8/2016 | |
| WO | 9419850 A1 | 9/1994 | |
| WO | 1999048305 | 9/1999 | |
| WO | 2001001533 A1 | 1/2001 | |
| WO | 2001001534 A1 | 1/2001 | |
| WO | 2005112477 A1 | 11/2005 | |
| WO | 2006055506 A2 | 5/2006 | |
| WO | 2008022058 A2 | 2/2008 | |
| WO | 2008022058 A3 | 11/2008 | |
| WO | 2009089306 A1 | 7/2009 | |
| WO | 2009103090 A2 | 8/2009 | |
| WO | 2009103090 A3 | 10/2009 | |
| WO | 2010028384 A2 | 3/2010 | |
| WO | 2010028384 A3 | 5/2010 | |
| WO | 2009089306 A4 | 6/2011 | |
| WO | 2011143431 A1 | 11/2011 | |
| WO | 2017105840 A1 | 6/2017 | |
| WO | 2018022721 A1 | 2/2018 | |

OTHER PUBLICATIONS

Information Disclosure Statement (IDS) Letter Regarding Common Patent Application(s), dated Apr. 1, 2025.
Information Disclosure Statement (IDS) Letter Regarding Common Patent Application(s), dated Oct. 5, 2024.
Chatsworth Products, Inc., "Thermal Management Solutions," Signature Solutions Brochure, available at Internet Web Page <www.chatsworth.com/passivecooling>, dated Mar. 2008 (6 pages).
"European Search Report" European Patent Application No. 11275109.4 for Chatsworth Products Inc., dated Sep. 18, 2014 (5 pages).
Rack Technologies PTY LTD, Product Catalog, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).

(56) References Cited

OTHER PUBLICATIONS

Emerson Network Power, Smart Cooling Solutions Data Center, Oct. 2012, Internet Web Page <http://www.emersonnetworkpower. com/en-EMEA/Products/RACKSANDINTEGRATEDCABINETS/ Documents/Knurr%20DCD/Smart-Cooling-Solutions-Data-Center-EN.pdf> (51 pages).

Eaton Corporation, Eaton Airflow Management Solutions: Installation Guide for Telescopic Chimney for SSeries Enclosures, Publication No. MN160007EN, dated 2014 (13 pages).

Eaton Corporation, Data Center Products: Eaton Telescopic Chimney, dated 2014 (2 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust Duct (VED) Instructions, dated 2009 (4 pages).

Panduit Corporation, Panduit Net-Access Vertical Exhaust System (VES) Specification Sheet, dated 2011 (4 pages).

Panduit Corporation, Panduit Vertical Exhaust Duct for N-Type and S-Type Cabinets: Installation Instructions, dated 2012 (14 pages).

Information Disclosure Statement (IDS) Letter Regarding Common Patent Application(s), dated Oct. 22, 2025.

* cited by examiner

*prior art*

*prior art*

CASTER ATTACHMENT SYSTEM USING MATING FEATURES

CROSS-REFERENCE TO RELATED APPLICATIONS

The present application is a U.S. continuation patent application of, and claims priority under 35 U.S.C. § 120 to, U.S. nonprovisional patent application Ser. No. 17/550,980, filed Dec. 14, 2021, which '980 application issued as U.S. Pat. No. 12,048,108 on Jul. 23, 2024, which '980 application and the patent issuing therefrom are each expressly incorporated by reference herein in their entirety, and which '980 application is a U.S. nonprovisional patent application of, and claims priority under 35 U.S.C. § 119 (e) to, U.S. provisional patent application Ser. No. 63/125,499, filed Dec. 15, 2020, which '499 application is incorporated by reference herein in its entirety. Additionally, the entirety of each of the following commonly-assigned U.S. provisional patent applications is incorporated herein by reference:

(a) U.S. provisional patent application Ser. No. 63/125,489, filed Dec. 15, 2020 and entitled, "SLIDABLE MOUNTING HARDWARE FOR ELECTRONIC EQUIPMENT ENCLOSURE," attached hereto as Appendix A;

(b) U.S. provisional patent application Ser. No. 63/125,504, filed Dec. 15, 2020 and entitled, "BRUSH PORT ASSEMBLY," attached hereto as Appendix B;

(c) U.S. provisional patent application Ser. No. 63/125,506, filed Dec. 15, 2020 and entitled, "FRAME STRUCTURE FOR ELECTRONIC EQUIPMENT ENCLOSURE," attached hereto as Appendix C; and The disclosure of each of the foregoing U.S. provisional patent applications is contained in the corresponding appendix, as designated above, each of which is likewise incorporated herein in its entirety by reference and is intended to provide background and technical information with regard to the systems and environments of the inventions of the current nonprovisional patent application.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to casters for an electronic equipment enclosure, and, in particular, to caster attachment systems and methods for attaching caster assemblies.

Background

Electronic equipment enclosures are heavily used to house server and other computer equipment in datacenters and other environments. The weight of such enclosures, even unloaded, can be quite significant. Thus, such enclosures frequently make use of casters to facilitate their movement over short or longer distances. However, current caster attachment methods impose practical limitations for installing and servicing caster assemblies.

A variety of caster attachment systems exist for current caster assemblies. For example, FIG. 1 is a fragmentary cutaway bottom perspective view of a lower corner of an electronic equipment enclosure utilizing a prior art caster attachment system that involves the use of pre-installed threaded studs and serrated flange nuts attached from beneath, while FIG. 2 is a fragmentary partially exploded interior orthogonal view of a corner of an electronic equipment enclosure utilizing a prior art caster attachment system that involves loose hardware.

The most convenient orientation for installing current casters is with the cabinet positioned on its side, rather than upright, so that the caster can be easily positioned onto pre-installed threaded studs (or loose hardware). Access to the fastener hardware is greatly diminished once the cabinet is upright with equipment installed. Furthermore, current caster attachment methods can cause expensive rework and scrap if the fastener installed during assembly or field replacement damages the installed threaded stud. Typical failure modes are cross-threading or stripped threads and damaged press-fit studs. If a threaded stud becomes loose in the cabinet frame when deployed in the field, it is common to scrap the entire cabinet.

In view of these and other disadvantages, a need exists for an improved caster attachment system for electronic equipment enclosures.

SUMMARY OF THE PRESENT INVENTION

Some exemplary embodiments of the present invention may overcome one or more of the above disadvantages and other disadvantages not described above, but the present invention is not required to overcome any particular disadvantage described above, and some exemplary embodiments of the present invention may not overcome any of the disadvantages described above.

The present invention includes many aspects and features. Moreover, while many aspects and features relate to, and are described in, the context of casters for an electronic equipment enclosure, the present invention is not limited to use only with respect to casters for an electronic equipment enclosure, as will become apparent from the following summaries and detailed descriptions of aspects, features, and one or more embodiments of the present invention.

Broadly defined, the present invention according to one aspect relates to a caster assembly for installation in an electronic equipment enclosure. The caster assembly includes a top plate, a forked support member, and an axled wheel. The top plate is attachable to a frame structure of the electronic equipment enclosure and includes a plurality of countersunk recesses. The forked support member connected directly or indirectly to the top plate, and the axled wheel is supported on the forked support member. The caster assembly is installable in an assembled electronic equipment enclosure by aligning the countersunk recesses of the top plate beneath mating features at an underside of the frame structure such that, once aligned, the weight of the assembled electronic equipment enclosure retains each mating feature of the frame structure within a respective one of the plurality of countersunk recesses in the top plate, thereby retaining the caster assembly in position to support the assembled electronic equipment enclosure.

In a feature of this aspect, the axled wheel is part of a fixed caster.

In another feature of this aspect, the axled wheel is part of a swiveled caster.

In another feature of this aspect, the top plate includes a nut attached beneath each of the plurality of countersunk recesses for accommodating a bolt passing through the frame structure and through a corresponding opening within each of the plurality of countersunk recesses. In another feature of this aspect, each nut is welded to an underside of the top plate.

In another feature of this aspect, the top plate includes a collar extending from an underside thereof at each of the plurality of countersunk recesses for accommodating a bolt passing through the frame structure and through a corresponding opening within each of the plurality of countersunk recesses. In another feature of this aspect, each collar is a tapped, extruded collar.

Broadly defined, the present invention according to another aspect relates to an electronic equipment enclosure. The electronic equipment enclosure includes a frame structure including a plurality of horizontal and vertical structural members and a plurality of caster assemblies secured to an underside of a lower set of horizontal structural members. Each caster assembly includes a top plate, a forked support member connected directly or indirectly to the top plate, and an axled wheel supported on the forked support member. Each top plate includes a plurality of countersunk recesses, each of which receives a corresponding mating feature at the underside of the lower set of horizontal structural members. The weight of the frame structure retains each mating feature within the corresponding countersunk recess, thereby retaining the caster assemblies in position to support the frame structure.

In a feature of this aspect, at least one of the plurality of caster assemblies includes a fixed caster.

In another feature of this aspect, at least one of the plurality of caster assemblies includes a swiveled caster.

In another feature of this aspect, each of the mating features of the lower set of horizontal structural members includes a countersunk opening. In another feature of this aspect, each countersunk recess of the top plates includes an opening located therein. In another feature of this aspect, each aligned pair of mating features and countersunk recesses includes a bolt passing through each of the countersunk opening of the mating feature and the opening within the countersunk recess.

In another feature of this aspect, each top plate includes a nut attached beneath each of the plurality of countersunk recesses for accommodating the bolt. In another feature of this aspect, each nut is welded to the corresponding top plate.

In another feature of this aspect, each top plate includes a collar extending from an underside thereof at each of the plurality of countersunk recesses for accommodating the bolt. In another feature of this aspect, each collar is a tapped, extruded collar.

Broadly defined, the present invention according to another aspect relates to a method of installing a caster assembly in an electronic equipment enclosure. The method includes: providing an electronic equipment enclosure having a lower frame comprised of a plurality of horizontal structural members, wherein one or more of the plurality of horizontal structural members includes a plurality of mating features at an underside thereof; providing a caster assembly having a top plate, a forked support member connected directly or indirectly to the top plate, and an axled wheel supported on the forked support member, wherein the top plate includes a plurality of countersunk recesses; positioning the caster assembly beneath one of the one or more horizontal structural members having the mating features; and aligning the caster assembly such that each mating feature is received within a corresponding countersunk recess of the top plate, wherein the weight of the electronic equipment enclosure retains each mating feature within the corresponding countersunk recess, thereby retaining the caster assembly in position to support the electronic equipment enclosure.

In a feature of this aspect, the caster assembly includes a fixed caster.

In another feature of this aspect, the caster assembly includes a swiveled caster.

In another feature of this aspect, each of the mating features includes a countersunk opening, and each countersunk recess of the top plate includes an opening. In another feature of this aspect, the method further includes positioning a bolt downward through each of the countersunk opening of the mating feature and the opening of the countersunk recess.

In another feature of this aspect, the top plate includes a nut attached beneath each countersunk recess for accommodating the bolt. In another feature of this aspect, each nut is welded to the top plate.

In another feature of this aspect, the top plate includes a collar extending from an underside thereof at each of the plurality of countersunk recesses for accommodating the bolt. In another feature of this aspect, each collar is a tapped, extruded collar.

Broadly defined, the present invention according to another aspect relates to a caster assembly for installation in an electronic equipment enclosure substantially as shown and described.

Broadly defined, the present invention according to another aspect relates to an electronic equipment enclosure including one or more caster assemblies substantially as shown and described.

Broadly defined, the present invention according to another aspect relates to a method of installing a caster assembly in an electronic equipment enclosure substantially as shown and described.

Broadly defined, the present invention according to another aspect relates to a caster assembly for installation in an electronic equipment enclosure. The caster assembly includes a top plate, a forked support member, and an axled wheel. The top plate is attachable to a frame structure of the electronic equipment enclosure and includes a plurality of countersunk recesses. The forked support member extends downward from the top plate, and the axled wheel is supported on the forked support member. The caster assembly is installable in an assembled electronic equipment enclosure by aligning the countersunk recesses of the top plate beneath mating features at an underside of the frame structure such that, once aligned, the weight of the assembled electronic equipment enclosure retains each mating feature of the frame structure within a respective one of the plurality of countersunk recesses in the top plate, thereby retaining the caster assembly in position to support the assembled electronic equipment enclosure.

In a feature of this aspect, the axled wheel is part of a fixed caster.

In another feature of this aspect, the axled wheel is part of a swiveled caster.

In another feature of this aspect, the top plate includes a fixed nut attached beneath each of the plurality of countersunk recesses for accommodating a bolt passing through the frame structure and through a corresponding opening within each of the plurality of countersunk recesses.

In another feature of this aspect, the top plate includes a collar extending from an underside thereof at each of the plurality of countersunk recesses for accommodating a bolt passing through the frame structure and through a corresponding opening within each of the plurality of countersunk recesses.

Broadly defined, the present invention according to another aspect relates to an electronic equipment enclosure. The electronic equipment enclosure includes a frame structure and a plurality of caster assemblies. The frame structure includes a plurality of horizontal and vertical structural members. The plurality of caster assemblies are secured to an underside of a lower set of horizontal structural members. Each caster assembly includes a top plate, a forked support member extending downward from the top plate, and an axled wheel supported on the forked support member. Each top plate includes a plurality of countersunk recesses, each of which receives a corresponding mating feature at the underside of the lower set of horizontal structural members. The weight of the frame structure retains each mating feature within the corresponding countersunk recess, thereby retaining the caster assemblies in position to support the frame structure.

In a feature of this aspect, at least one of the plurality of caster assemblies includes a fixed caster.

In another feature of this aspect, at least one of the plurality of caster assemblies includes a swiveled caster.

In another feature of this aspect, each of the mating features of the lower set of horizontal structural members includes a countersunk opening. In another feature of this aspect, each countersunk recess of the top plates includes an opening located therein. In another feature of this aspect, each aligned pair of mating features and countersunk recesses includes a bolt passing through each of the countersunk opening of the mating feature and the opening within the countersunk recess.

In another feature of this aspect, each top plate includes a fixed nut attached beneath each of the plurality of countersunk recesses for accommodating the bolt.

In another feature of this aspect, each top plate includes a collar extending from an underside thereof at each of the plurality of countersunk recesses for accommodating the bolt.

Broadly defined, the present invention according to another aspect relates to a method of installing a caster assembly in an electronic equipment enclosure. The method includes: providing an electronic equipment enclosure having a lower frame comprised of a plurality of horizontal structural members, wherein one or more of the plurality of horizontal structural members includes a plurality of mating features at an underside thereof; providing a caster assembly having a top plate, a forked support member extending downward from the top plate, and an axled wheel supported on the forked support member, wherein the top plate includes a plurality of countersunk recesses; positioning the caster assembly beneath one of the one or more horizontal structural members having the mating features; and aligning the caster assembly such that each mating feature is received within a corresponding countersunk recess of the top plate, wherein the weight of the electronic equipment enclosure retains each mating feature within the corresponding countersunk recess, thereby retaining the caster assembly in position to support the electronic equipment enclosure.

In a feature of this aspect, the caster assembly includes a fixed caster.

In another feature of this aspect, the caster assembly includes a swiveled caster.

In another feature of this aspect, each of the mating features includes a countersunk opening, and each countersunk recess of the top plate includes an opening. In another feature of this aspect, the method further includes positioning a bolt downward through each of the countersunk opening of the mating feature and the opening of the countersunk recess.

In another feature of this aspect, the top plate includes a fixed nut attached beneath each countersunk recess for accommodating the bolt.

In another feature of this aspect, the top plate includes a collar extending from an underside thereof at each of the plurality of countersunk recesses for accommodating the bolt.

Further areas of applicability of the present invention will become apparent from the detailed description provided hereinafter. It should be understood that the detailed description and specific examples, while indicating preferred embodiment(s) of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
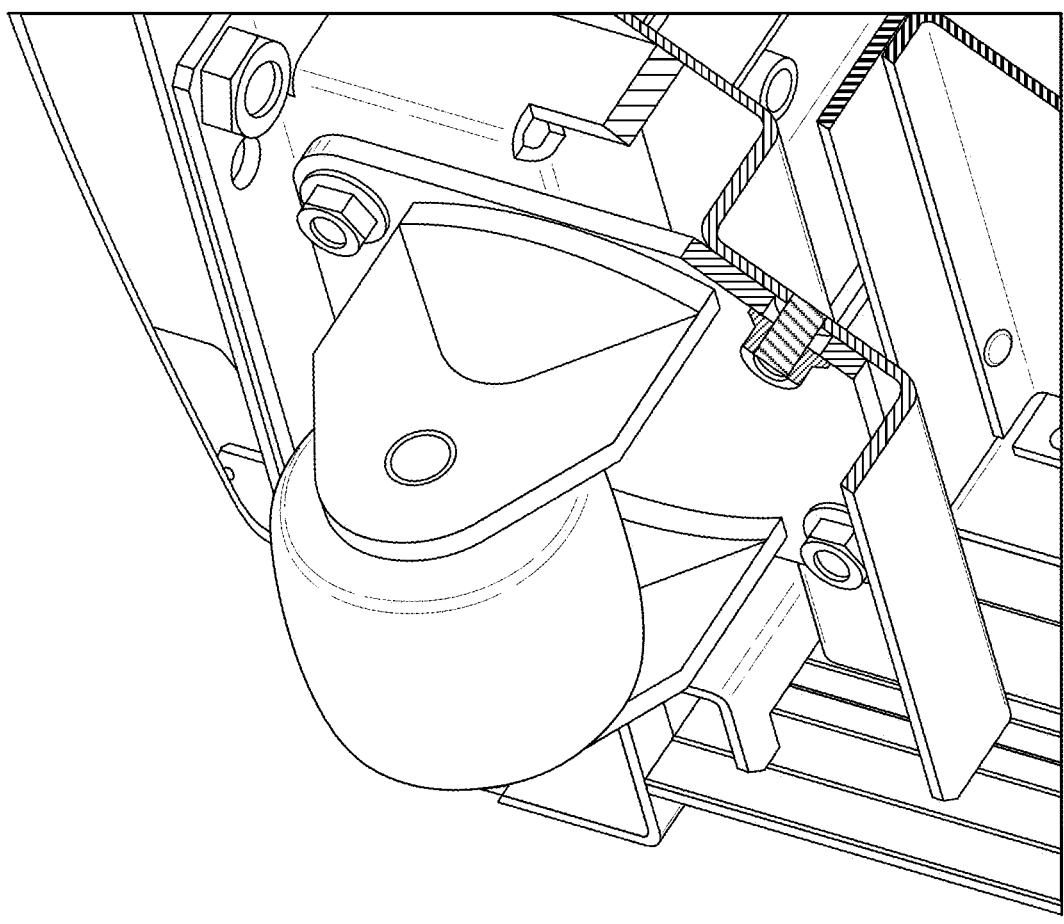
FIG. 1 is a fragmentary cutaway bottom perspective view of a lower corner of an electronic equipment enclosure utilizing a prior art caster attachment system.
Figure 2:
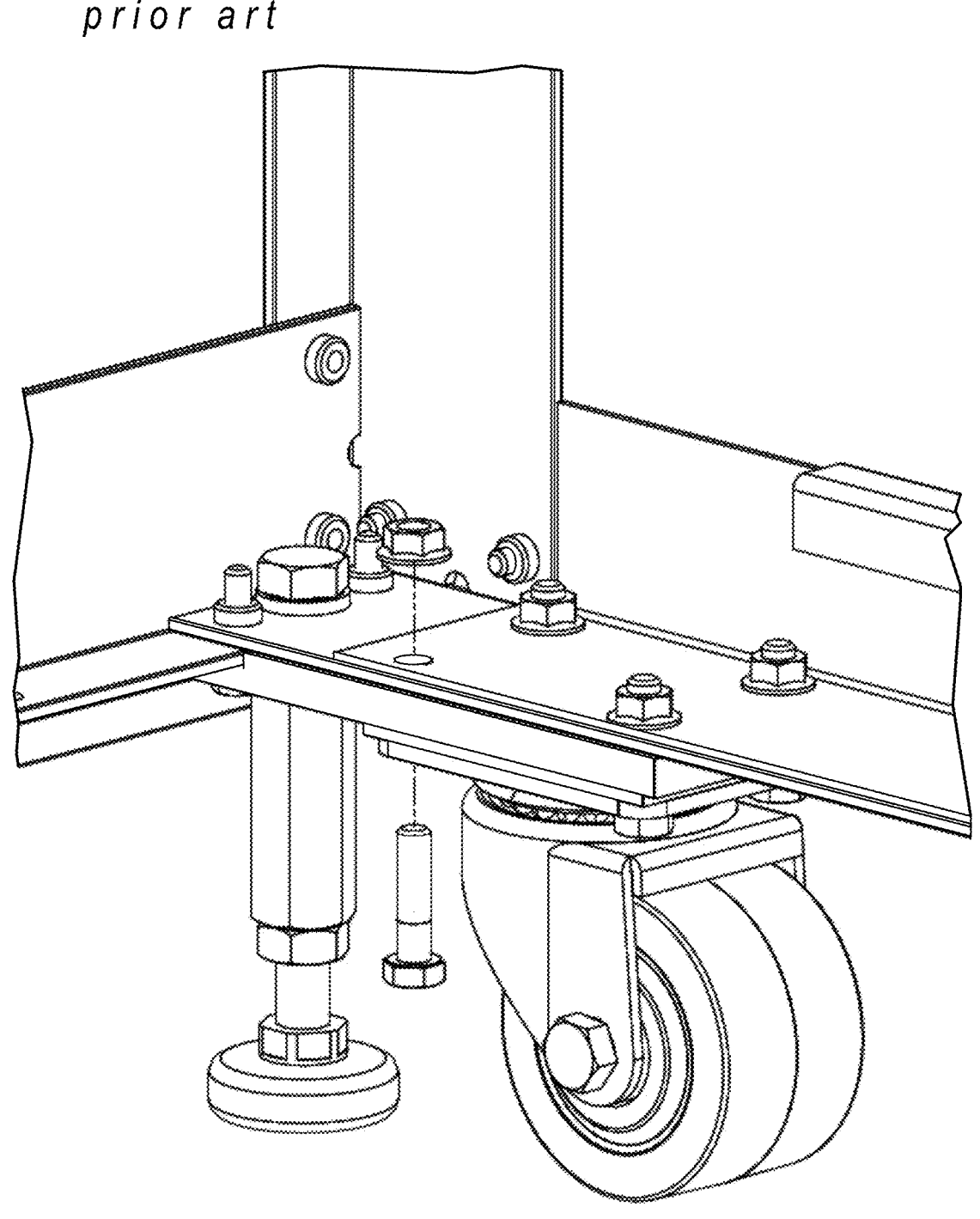
FIG. 2 is a fragmentary partially exploded interior orthogonal view of a corner of an electronic equipment enclosure utilizing another prior art caster attachment system.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Furthermore, an embodiment of the invention may incorporate only one or a plurality of the aspects of the invention disclosed herein; only one or a plurality of the features disclosed herein; or combination thereof. Moreover, many embodiments, including adaptations, variations, modifications, and equivalent arrangements, are implicitly disclosed herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention in any claim of a patent issuing here from, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the issued claim(s) rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term-differs in any way from any particular dictionary definition of such term, it is intended that the meaning of the term as understood by the Ordinary Artisan should prevail.

With regard solely to construction of any claim with respect to the United States, no claim element is to be interpreted under 35 U.S.C. 112 (f) unless the explicit phrase "means for" or "step for" is actually used in such claim element, whereupon this statutory provision is intended to and should apply in the interpretation of such claim element. With regard to any method claim including a condition precedent step, such method requires the condition precedent to be met and the step to be performed at least once during performance of the claimed method.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Further, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 3A:
FIG. 3A is an isometric view of an electronic equipment enclosure having a caster attachment system in accordance with one or more preferred embodiments of the present invention.
Figure 3B:
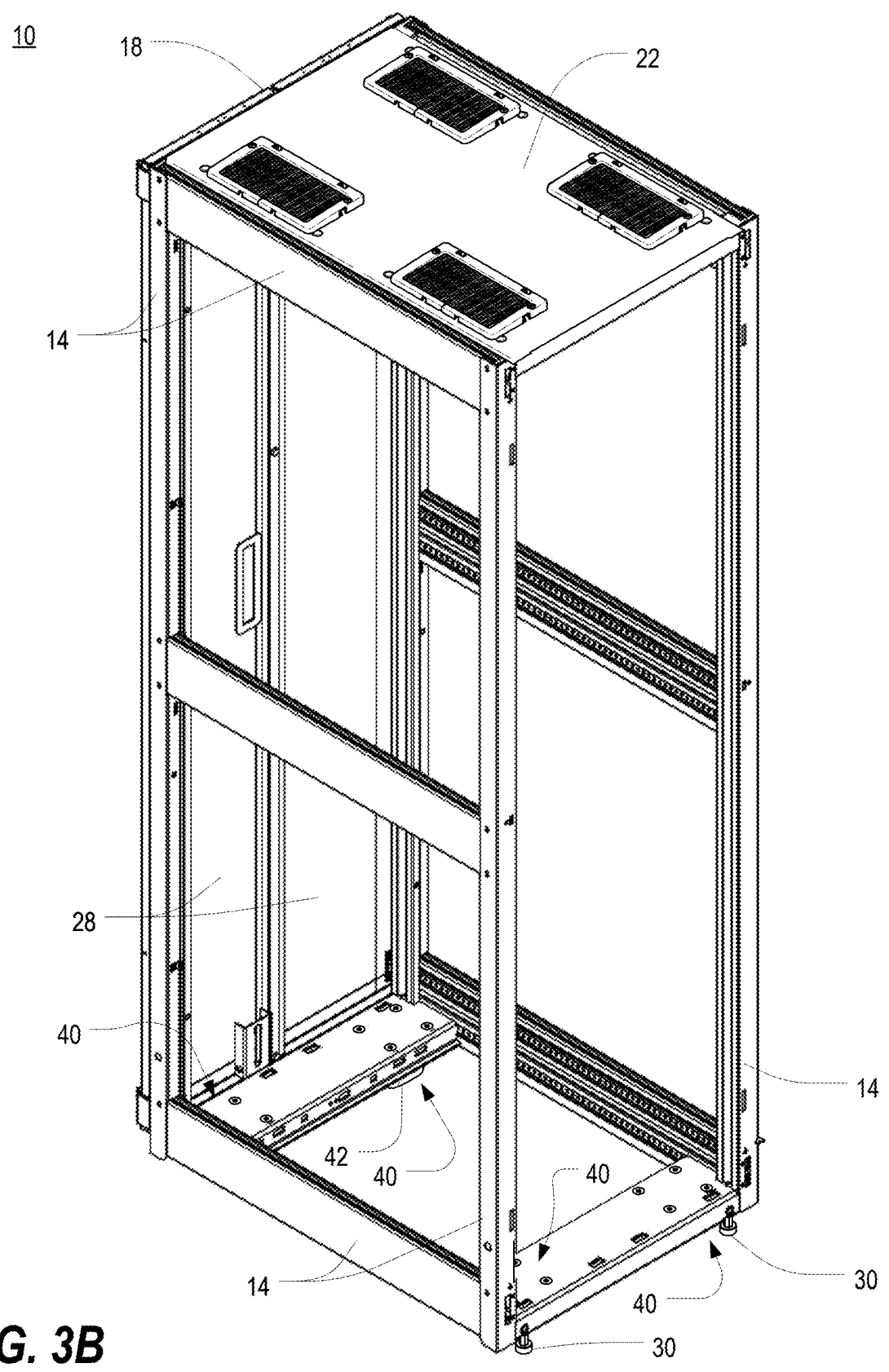
FIG. 3B is an isometric view of the electronic equipment enclosure and caster attachment system of FIG. 3A, shown with the front door removed.

FIG. 3A is an isometric view of an electronic equipment enclosure 10 having a caster system 40 in accordance with one or more preferred embodiments of the present invention; and FIG. 3B is an isometric view of the electronic equipment enclosure 10 and caster system 40 of FIG. 3A, shown with the front door removed. As shown therein, the enclosure 10 includes a four-post frame structure 14 supporting a front panel assembly 16, a rear panel assembly 18, and a top panel assembly 22. Although not shown, the frame structure 14 may further support a pair of side panel assemblies, a bottom panel assembly, and/or other structures. In the illustrated embodiment, the front panel assembly 16 is implemented as a single hinged door 26; the rear panel assembly 18 is implemented as a pair of hinged doors 28; and the top panel assembly 22 includes a primary panel and a plurality of ports 25. However, it will be appreciated that various replacement components may be substituted for the components of the enclosure system, without departing from the scope of the present invention.

Figure 4:
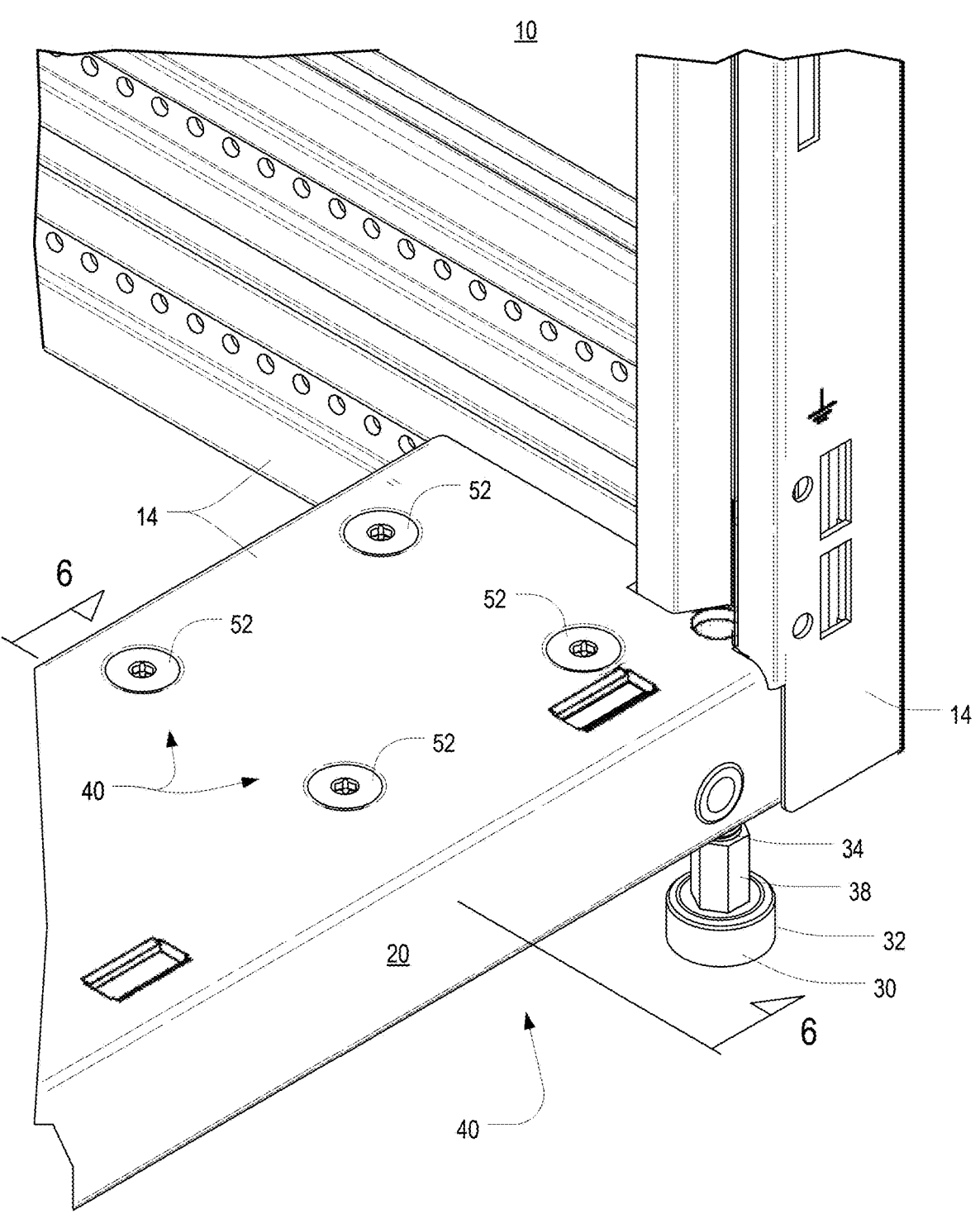
FIG. 4 is an enlarged fragmentary isometric view of a corner of the electronic equipment enclosure and caster attachment system of FIG. 3B.
Figure 5:
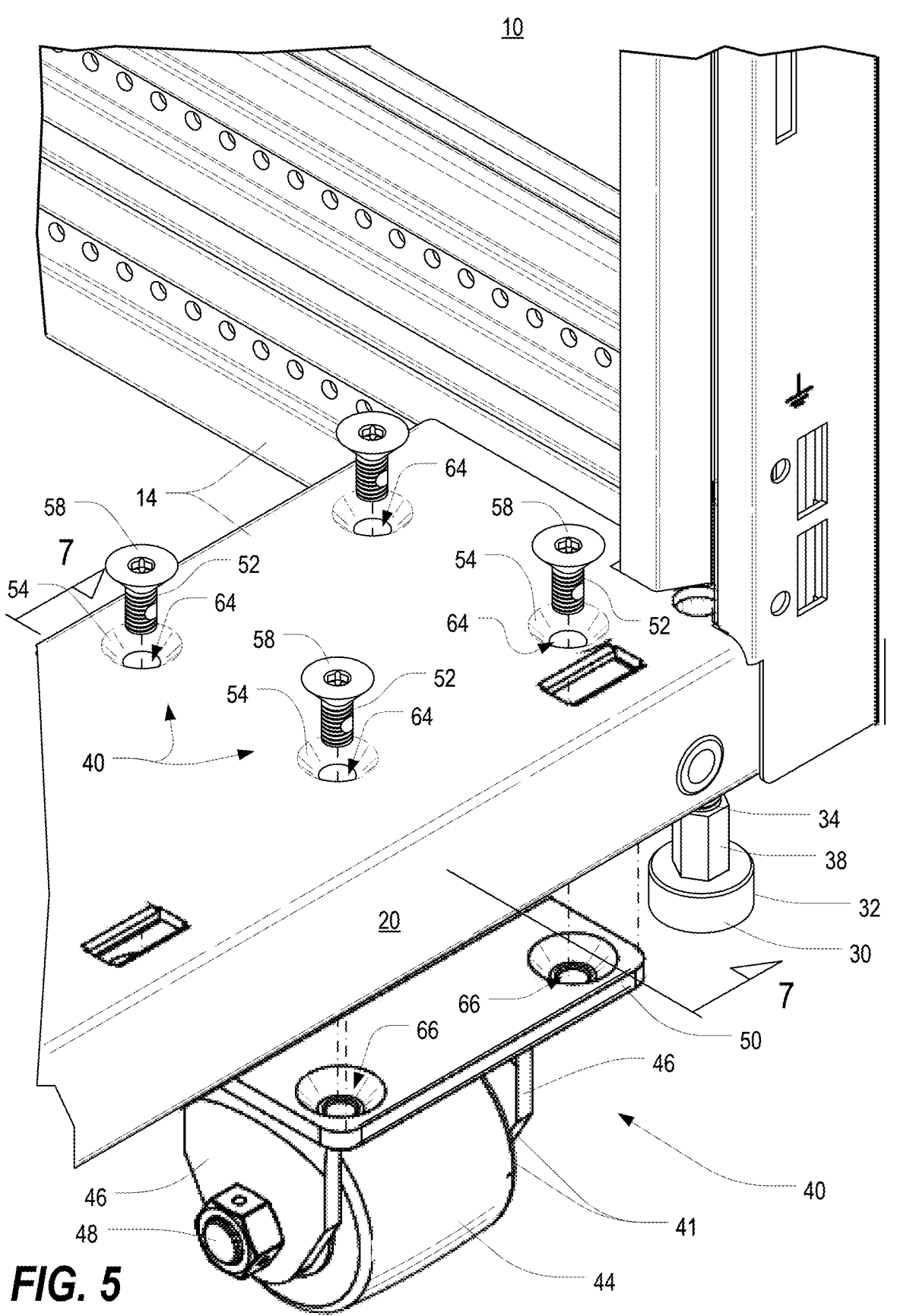
FIG. 5 is an exploded fragmentary isometric view of the corner of the electronic equipment enclosure and caster attachment system of FIG. 4.

The electronic equipment enclosure 10 includes two support systems. In this regard, reference is made to FIGS. 4 and 5, wherein FIG. 4 is an enlarged fragmentary isometric view of a corner of the electronic equipment enclosure 10 and caster system 40 of FIG. 3B, and FIG. 5 is an exploded fragmentary isometric view of the corner of the electronic equipment enclosure and caster system of FIG. 4.

The first support system includes four leveling feet 30 disposed near the four bottom corners of the enclosure 10. Each foot 30 includes a pad 32, a threaded stud 34, a support block 36 (shown in FIG. 6) for receiving the threaded stud 34, and a large hexagonal head 38 for screwing the stud 34 into or out of the support block 36. The support block 36 is attached to the frame structure 14 of the enclosure 10 such that the weight of the enclosure 10 is reliably transferred to the support blocks 36. The feet 30 may be adjusted by rotating the hexagonal head 38, by hand or using a wrench, such that the bottom of the pad 32 rests firmly on the floor. Because each leveling foot 30 may be adjusted individually, further adjustment may be necessary in order to level the enclosure 10, both side-to-side and front-to-back, if the floor is uneven.

The second support system is a caster system 40 that includes four caster assemblies 41,42. In at least some embodiments, two of the caster assemblies 41 utilize fixed casters while the other two assemblies 42 utilize swivel casters, but in relevant respects the two types of caster assemblies 41,42 are similar, and, except where otherwise noted, are generally treated the same herein. Each caster assembly 41,42 includes a heavy duty wheel 44 (optionally including a tread), a fork 46, an axle 48 (commonly including an axle bolt, an axle nut, bushings, and ball bearings), and a top plate 50. (The swivel caster assemblies 42 further include a swivel (not shown) that includes an inner raceway, an outer raceway, a plurality of ball bearings, and perhaps other elements.) The wheel 44 is carried by the axle 48, which in turn is carried by the fork 46. In fixed caster assemblies 41, the top plate 50 is carried directly on the fork 46, while in swivel caster assemblies 42, the swivel is commonly interposed between the fork 46 and the top plate 50.

Figure 6:
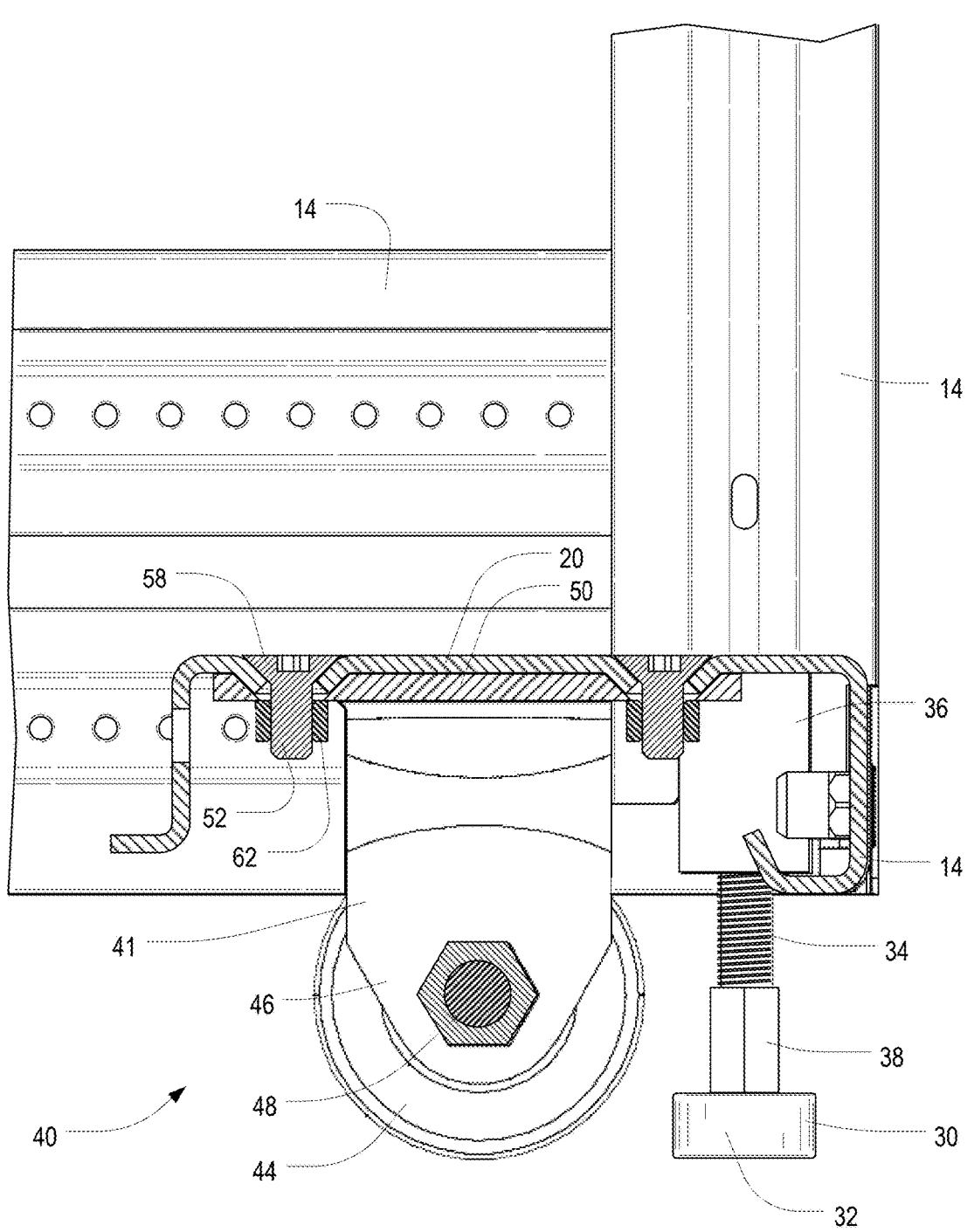
FIG. 6 is a left side cross-sectional view of the corner of the electronic equipment enclosure and caster attachment system of FIG. 4.
Figure 7:
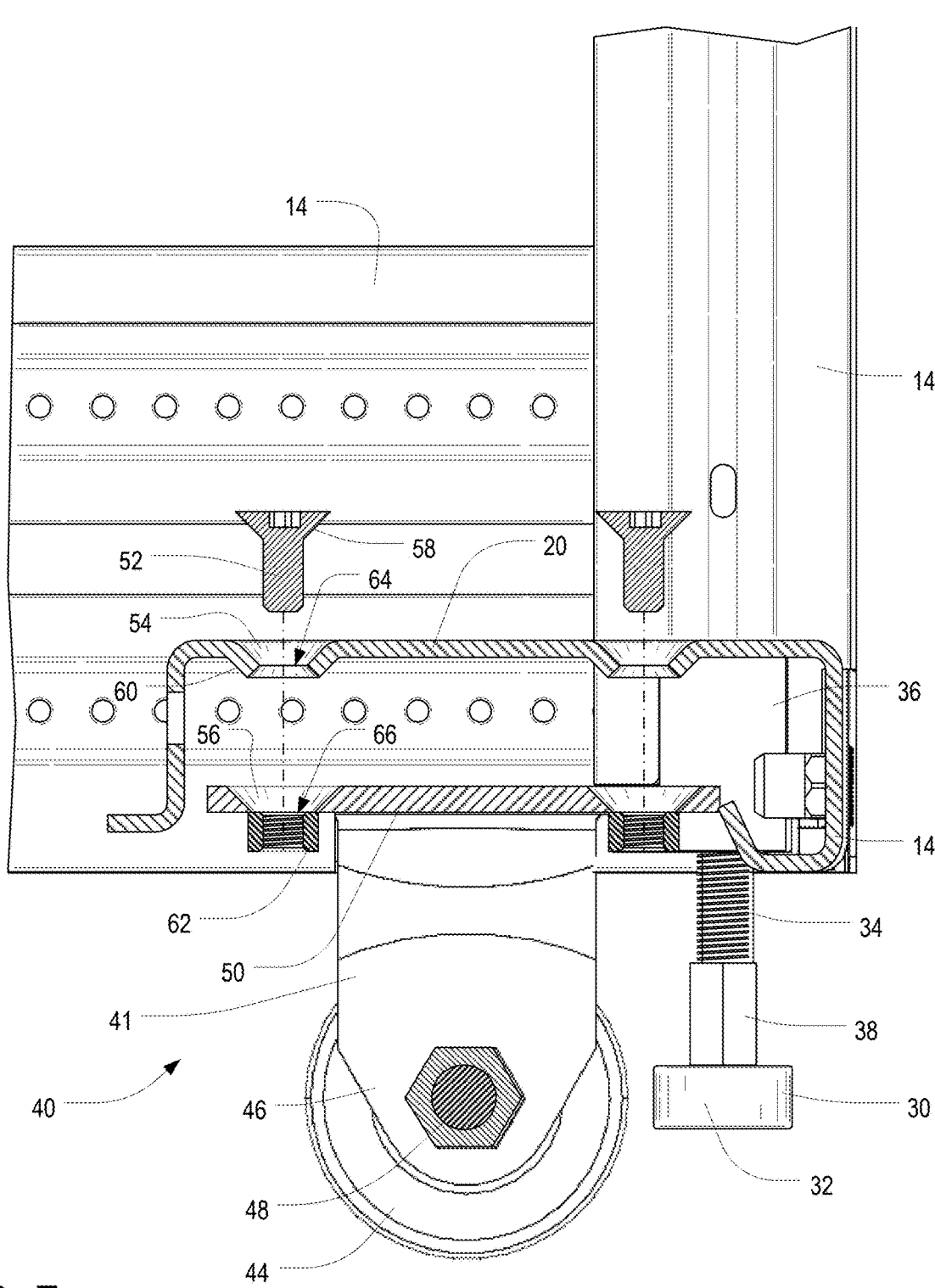
FIG. 7 is a left side cross-sectional view of the corner of the electronic equipment enclosure and caster attachment system of FIG. 5.

The top plate 50 is attached to the frame structure 14 of the enclosure 10, via a plurality of fasteners 52, such that the weight of the enclosure 10 is reliably transferred to the top plate 50. In the illustrated embodiment, the top plate 50 is fastened to a cross member 20 of the frame structure 14 via fasteners 52 inserted through aligned apertures 64,66 in the cross member 20 and top plate 50 and coupled to welded nuts 62 on the underside of the top plate 50. In this regard, FIG. 6 is a left side cross-sectional view of the corner of the electronic equipment enclosure 10 and caster system 40 of FIG. 4, and FIG. 7 is an exploded left side cross-sectional view of the corner of the electronic equipment enclosure 10 and caster system 40 of FIG. 5. As perhaps best shown in FIGS. 5 and 7, the top surface of the cross member 20 and the top surface of the top plate 50 each include a respective plurality of formed features 54,56 centered around the apertures 64,66. The formed features 54 in the cross member 20 are each shaped to receive the underside of a head 58 of a respective fastener 52 such that the head 58 is countersunk into the surface of the cross member 20. The underside of the cross member 20 has a corresponding mating feature 60 extending downward beneath each formed feature 54, and the formed features 56 in the top surface of the top plate 50 are each shaped to receive such mating features 60.

Figure 8:
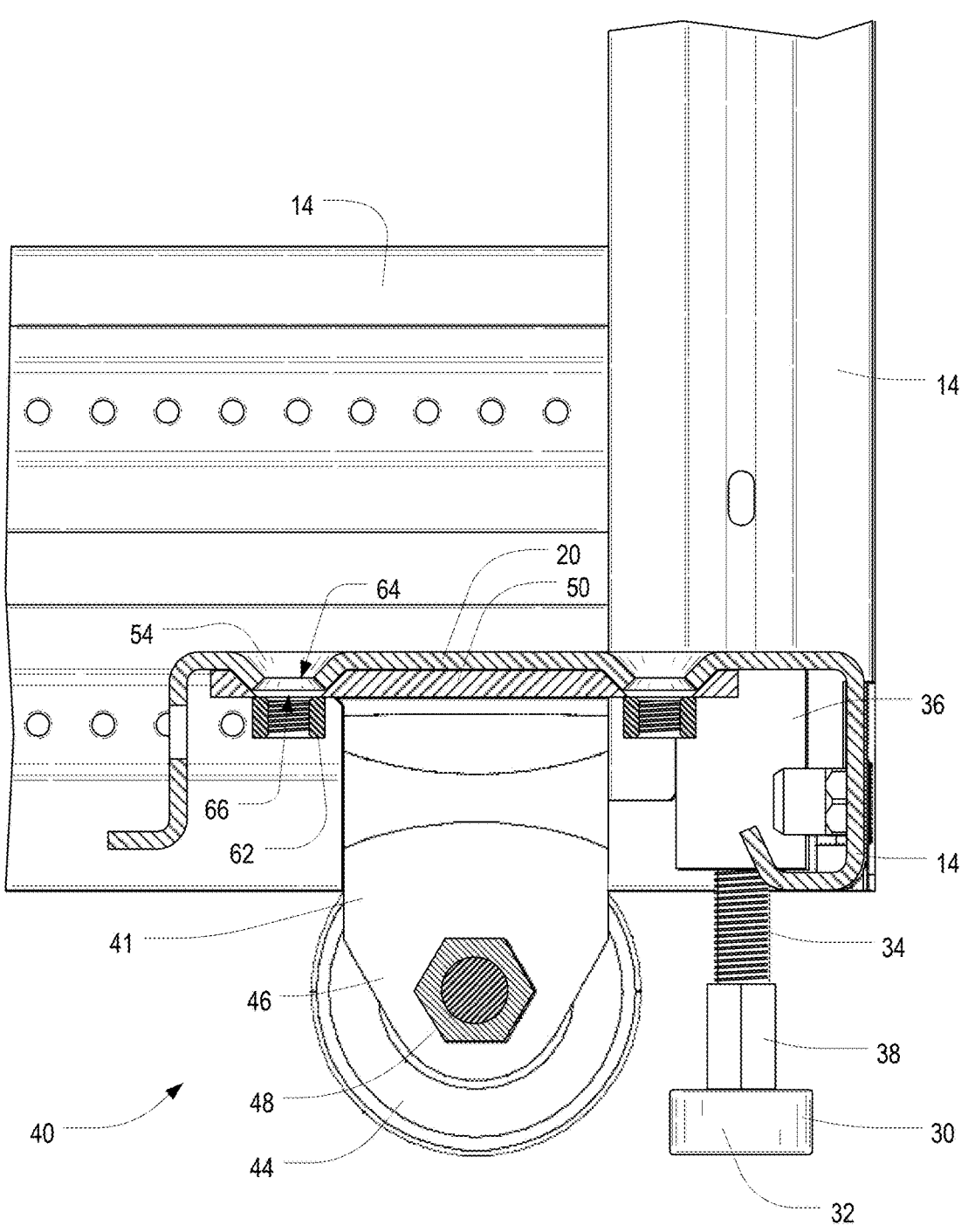
FIG. 8 is a left side cross-sectional view of the corner of the electronic equipment enclosure and caster attachment system of FIG. 4, showing the caster assembly in a partially installed state.

Advantageously, the combination of features in the top plate 50 and cross member 20 allow the caster assembly 41,42 to be installed quickly and easily. In this regard, FIG. 8 is a left side cross-sectional view of the corner of the electronic equipment enclosure and caster attachment system of FIG. 4, showing the caster assembly 41 in a partially installed state. As shown therein, the caster assembly 41 has been positioned beneath the enclosure 10 such that the features 60 in the bottom of the cross member 20 are seated in the formed features 56 in the top plate 50. Although no fasteners 52 have been installed in FIG. 8, the weight of the enclosure 10 keeps the features 56,60 seated in place, making it nearly impossible for the caster assembly 41 to shift relative to the cross member 20. Furthermore, the corresponding mating shapes of the features 56,60 makes it possible to locate the caster assembly 41 properly beneath the cross member 20 and to do so by feel, rather than requiring visual location by the installer. Still further, the features, 56,60, and especially their conical shape, causes the apertures 64,66 to be aligned automatically as the features 56,60 are seated, thereby eliminating the need to carefully align the apertures 64,66 visually in order to facilitate inserting a fastener 52 therethrough.

The countersunk feature of the caster top plate 50 shown herein may be milled or coined in place, and results in a flat lower surface of the caster top plate 50. Alternatively, however, a countersink emboss feature, like that used on the cross member 20, could be used.

The fastener heads 58 illustrated herein are arranged to receive a flat head star drive, but various alternative fastener head designs having a conical lower face may alternatively be used. Furthermore, although perhaps more complicated and/or less convenient, a standard fastener head with a non-conical lower face may be used in some embodiments.

Figure 9:
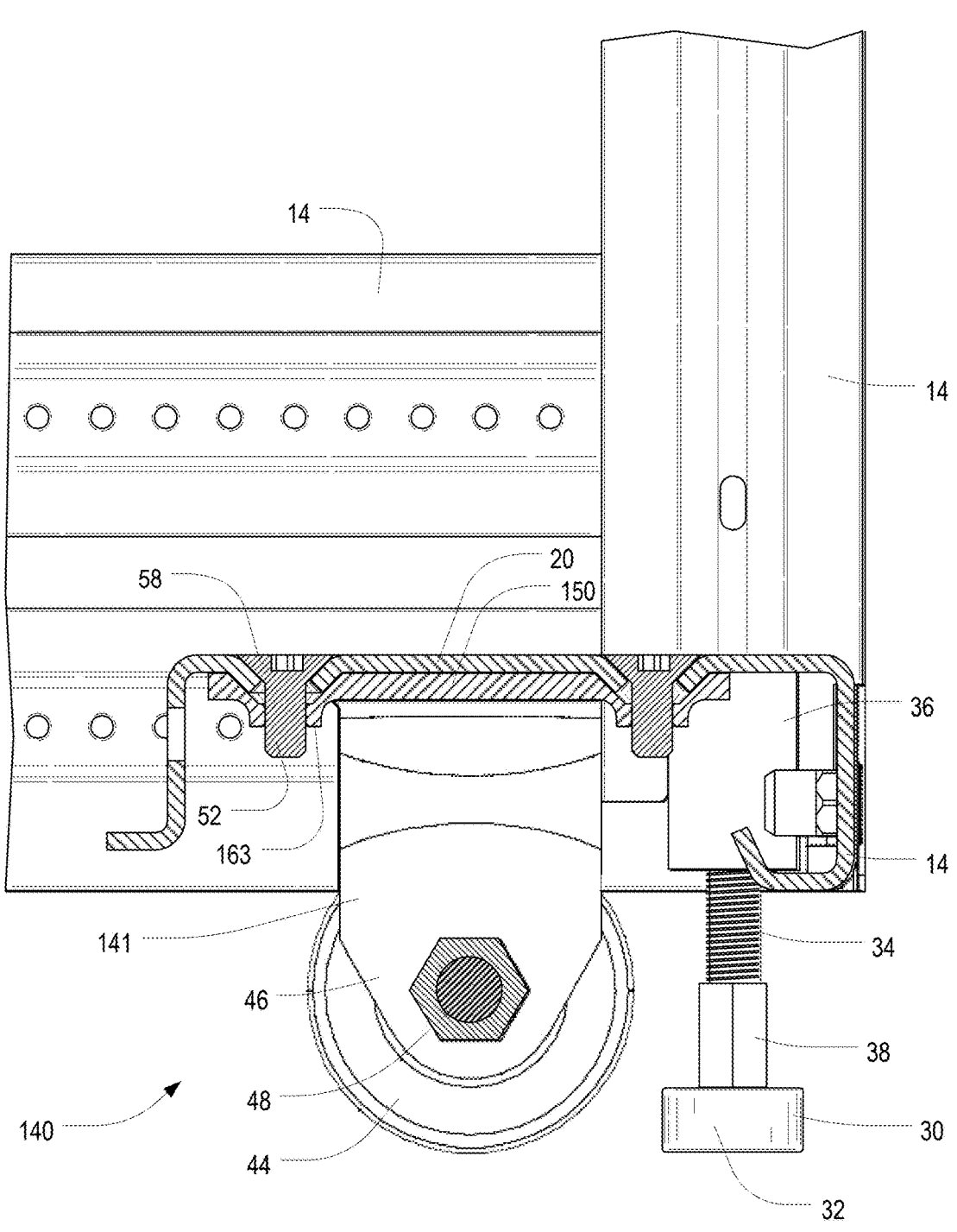
FIG. 9 is a left side cross-sectional view of a corner of an electronic equipment enclosure and caster attachment system in accordance with another preferred embodiment of the present invention.
Figure 10:
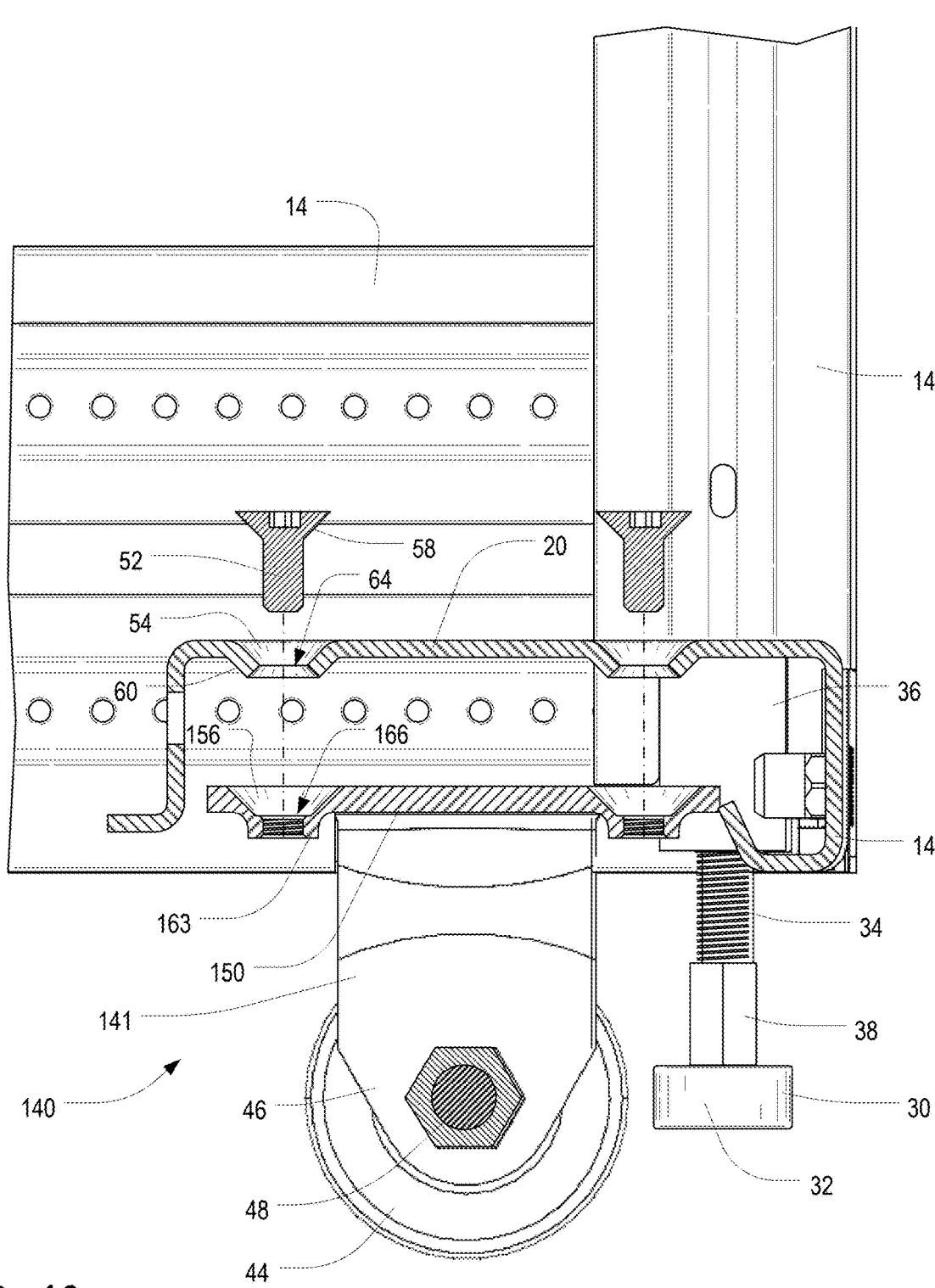
FIG. 10 is an exploded left side cross-sectional view of the corner of the electronic equipment enclosure and caster attachment system of FIG. 9.
Figure 11:
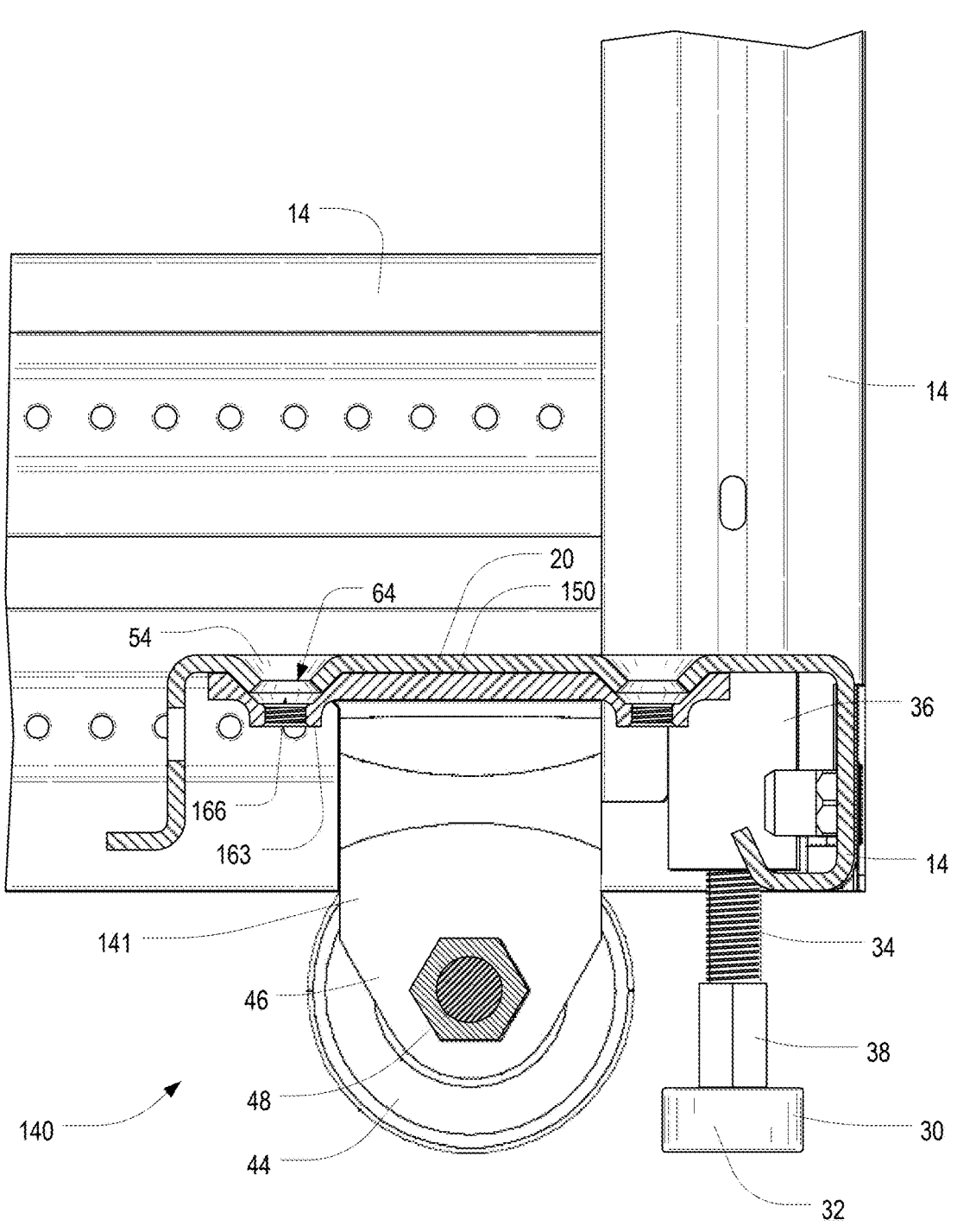
FIG. 11 is a left side cross-sectional view of the corner of the electronic equipment enclosure and caster attachment system of FIG. 9, showing a caster assembly in a partially installed state.

In the embodiment illustrated in FIGS. 4-8, a threaded nut 62 is welded to the underside of the top plate 50 in alignment with each aperture 66. Use of such a fixed nut 62 makes it possible to attach and properly torque the fastener 52, and subsequently verify such torque, without need to access the welded nut 62. However, other approaches may be utilized as well, such as a self-tapping screw with a formed collar feature. In various other embodiments, alternative nut types may be utilized, including rivet nuts, cage nuts, and the like. In this regard, FIG. 9 is a left side cross-sectional view of a corner of an electronic equipment enclosure and caster attachment system 140 in accordance with another preferred embodiment of the present invention, while FIG. 10 is an exploded left side cross-sectional view of the corner of the electronic equipment enclosure and caster attachment system 140 of FIG. 9, and FIG. 11 is a left side cross-sectional view of the corner of the electronic equipment enclosure and caster attachment system 140 of FIG. 9, showing a caster assembly 141 in a partially installed state.

As with the electronic equipment enclosure 10 of FIGS. 4 and 5, two support systems may be provided, with the first support system being similar to that of FIGS. 4 and 5. The second support system is a caster system 140 that may include four caster assemblies. The caster assembly 141 in FIGS. 9-11 utilizes a fixed caster, but other caster assemblies may utilize swivel casters, and in relevant respects the two types of caster assemblies are similar, and, except where otherwise noted, are generally treated the same herein. The caster assembly 141 includes a heavy duty wheel 44 (optionally including a tread), a fork 46, an axle 48 (commonly including an axle bolt, an axle nut, bushings, and ball bearings), and a top plate 150. (The swivel caster assemblies further include a swivel (not shown) that includes an inner raceway, an outer raceway, a plurality of ball bearings, and perhaps other elements.) The wheel 44 is carried by the axle 48, which in turn is carried by the fork 46. In fixed caster assemblies 141, the top plate 150 is carried directly on the fork 46, while in swivel caster assemblies, the swivel is commonly interposed between the fork and the top plate 150.

The top plate 150 is attached to the frame structure 14 of the enclosure 10, via a plurality of fasteners 52, such that the weight of the enclosure 10 is reliably transferred to the top plate 150. In the illustrated embodiment, the top plate 150 is fastened to a cross member 20 of the frame structure 14 via fasteners 52 inserted through aligned apertures 64,166 in the cross member 20 and top plate 150 and coupled to a tapped, extruded collar 163 extending from the underside of the top plate 150. As perhaps best shown in FIG. 10, the top surface of the cross member 20 and the top surface of the top plate 150 each include a respective plurality of formed features 54,156 centered around the apertures 64,166. The formed features in the cross member 20 are each shaped to receive the underside of a head 58 of a respective fastener 52 such that the head 58 is countersunk into the surface of the cross member 20. The underside of the cross member 20 has a corresponding mating feature 60 extending downward beneath each formed feature 54, and the formed features 156 in the top surface of the top plate 150 are each shaped to receive such mating features 60.

Advantageously, the combination of features in the top plate 150 and cross member 20 allow the caster assembly 141 to be installed quickly and easily. As shown in FIG. 11, the caster assembly 141 has been positioned beneath the enclosure 10 such that the features 60 in the bottom of the cross member 20 are seated in the formed features 156 in the top plate 150. Although no fasteners 52 have been installed in FIG. 11, the weight of the enclosure 10 keeps the features 156,60 seated in place, making it nearly impossible for the caster assembly 141 to shift relative to the cross member 20. Furthermore, the corresponding mating shapes of the features 156,60 makes it possible to locate the caster assembly 141 properly beneath the cross member 20 and to do so by feel, rather than requiring visual location by the installer. Still further, the features, 156,60, and especially their conical shape, causes the apertures 64,166 to be aligned automatically as the features 156,60 are seated, thereby eliminating the need to carefully align the apertures 64,166 visually in order to facilitate inserting a fastener 52 therethrough.

As will be evident from the illustrations and the foregoing discussion, the arrangement of FIGS. 9-11 provides many of the same advantages as the arrangement of FIGS. 4-8, but replaces the separately-installed weld nuts 62 with tapped collars 163. As a result, the overall part count is reduced, and the weld process itself is avoided, both of which may be advantageous in some situations.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claim(s) appended hereto and the equivalents thereof.

What is claimed is:

1. A caster assembly for installation in an electronic equipment enclosure, the caster assembly comprising:
   a top plate attachable to a frame structure of the electronic equipment enclosure, the top plate including a plurality of generally circular countersunk recesses, each of which includes a generally concentrically arranged opening therein;
   a forked support member extending downward from the top plate; and
   an axled wheel supported on the forked support member;

wherein the caster assembly is installable in an assembled electronic equipment enclosure by aligning the countersunk recesses of the top plate beneath mating features at an underside of the frame structure such that, once aligned, the weight of the assembled electronic equipment enclosure retains each mating feature of the frame structure within a respective one of the plurality of countersunk recesses in the top plate, thereby retaining the caster assembly in position to support the assembled electronic equipment enclosure.

2. The caster assembly of claim 1, wherein the axled wheel is part of a fixed caster.

3. The caster assembly of claim 1, wherein the axled wheel is part of a swiveled caster.

4. The caster assembly of claim 1, wherein the top plate includes a fixed nut attached beneath each of the plurality of countersunk recesses for threadedly receiving a generally cylindrical shaft of a fastener passing through the frame structure and through the generally concentrically arranged opening.

5. The caster assembly of claim 1, wherein the top plate includes a collar extending from an underside thereof at each of the plurality of countersunk recesses for threadedly receiving a generally cylindrical shaft of a fastener passing through the frame structure and through the generally concentrically arranged opening.

6. A caster assembly for installation in an electronic equipment enclosure, the caster assembly comprising:
   a plate having a flat top surface, the plate being attachable to a frame structure of the electronic equipment enclosure and including a plurality of countersunk recesses each having an opening therein;
   a forked support member extending downward from the plate; and
   an axled wheel supported on the forked support member;
   wherein each countersunk recess is defined by a conical surface initiating at the flat top surface and terminating at the corresponding opening; and
   wherein the caster assembly is installable in an assembled electronic equipment enclosure by aligning the countersunk recesses of the plate beneath mating features at an underside of the frame structure such that, once aligned, the weight of the assembled electronic equipment enclosure retains each mating feature of the frame structure within a respective one of the plurality of countersunk recesses in the plate, thereby retaining the caster assembly in position to support the assembled electronic equipment enclosure.

7. The caster assembly of claim 6, wherein the axled wheel is part of a fixed caster.

8. The caster assembly of claim 6, wherein the axled wheel is part of a swiveled caster.

9. The caster assembly of claim 6, wherein the plate includes a fixed nut attached beneath each of the plurality of countersunk recesses for receiving a fastener passing through the frame structure and through the opening.

10. The caster assembly of claim 6, wherein the plate includes a collar extending from an underside thereof at each of the plurality of countersunk recesses for receiving a fastener passing through the frame structure and through the opening.

11. A caster assembly for installation in an electronic equipment enclosure, the caster assembly comprising:
   a plate having a flat top surface and a bottom surface, the plate being attachable to a frame structure of the electronic equipment enclosure and including a plurality of countersunk recesses each defined by a conical surface initiating at the flat top surface and terminating at the bottom surface;

a forked support member extending downward from the plate; and an axled wheel supported on the forked support member;

wherein the caster assembly is installable in an assembled electronic equipment enclosure by aligning the countersunk recesses of the plate beneath mating features at an underside of the frame structure such that, once aligned, the weight of the assembled electronic equipment enclosure retains each mating feature of the frame structure within a respective one of the plurality of countersunk recesses in the plate, thereby retaining the caster assembly in position to support the assembled electronic equipment enclosure.

12. The caster assembly of claim 11, wherein the axled wheel is part of a fixed caster.

13. The caster assembly of claim 11, wherein the axled wheel is part of a swiveled caster.

14. The caster assembly of claim 11, wherein each countersunk recess includes an opening located therein.

15. The caster assembly of claim 14, wherein each opening is generally concentrically arranged within the countersunk recess.

16. The caster assembly of claim 15, wherein the plate includes a fixed nut attached beneath each countersunk recess for receiving a fastener passing through the frame structure and through the opening.

17. The caster assembly of claim 16, wherein the fastener is threadedly received at the fixed nut.

18. The caster assembly of claim 15, wherein the plate includes a collar extending from an underside thereof at each countersunk recess for receiving a fastener passing through the frame structure and through the opening.

19. The caster assembly of claim 18, wherein the fastener is threadedly received at the collar.

* * * * *